United States Patent
Kang et al.

(10) Patent No.: US 12,392,656 B2
(45) Date of Patent: Aug. 19, 2025

(54) MULTILAYER REFLECTIVE STACK FOR REDUCING CROSSTALK IN SPLIT PIXEL IMAGE SENSORS

(71) Applicant: OMNIVISION TECHNOLOGIES, INC., Santa Clara, CA (US)

(72) Inventors: Heesoo Kang, Cupertino, CA (US); Cynthia Sun Yee Lee, Santa Clara, CA (US); Bill Phan, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 482 days.

(21) Appl. No.: 18/076,084

(22) Filed: Dec. 6, 2022

(65) Prior Publication Data
US 2024/0186353 A1    Jun. 6, 2024

(51) Int. Cl.
*H01L 21/00* (2006.01)
*G01J 1/04* (2006.01)
*H01L 23/00* (2006.01)
*H10F 39/00* (2025.01)

(52) U.S. Cl.
CPC ........ *G01J 1/0422* (2013.01); *H10F 39/8053* (2025.01)

(58) Field of Classification Search
CPC ...... G01J 1/0422; H10F 39/024; H10F 39/18; H10F 39/8053; H10F 39/8057; H10F 39/8063; H10F 39/8067
See application file for complete search history.

(56) References Cited

U.S. PATENT DOCUMENTS

| | | |
|---|---|---|
| 2005/0045928 A1 | 3/2005 | Kuriyama |
| 2015/0333099 A1 | 11/2015 | Lyu et al. |
| 2016/0372507 A1 | 12/2016 | Yang et al. |
| 2017/0078539 A1* | 3/2017 | Madurawe .......... H10F 39/8067 |
| 2018/0366513 A1 | 12/2018 | Yang et al. |
| 2021/0151482 A1 | 5/2021 | Phan et al. |
| 2022/0246659 A1* | 8/2022 | Inoue .................. H10F 39/8067 |
| 2022/0367551 A1* | 11/2022 | Inoue .................. H10F 39/8053 |

* cited by examiner

*Primary Examiner* — Mark R Gaworecki
(74) *Attorney, Agent, or Firm* — Christensen O'Connor Johnson Kindness PLLC

(57) ABSTRACT

An image sensor comprising a semiconductor substrate, a plurality of photodiodes, a multilayer reflective stack, and a dielectric layer is disclosed. The plurality of photodiodes is disposed within the semiconductor substrate and includes a first photodiode and a second photodiode adjacent to the first photodiode. The multilayer reflective stack comprises a first material having a first refractive index and a second material having a second refractive index. The dielectric layer has a third refractive index and is disposed between the first photodiode and the multilayer reflective stack. The first material is disposed between the second material and the dielectric layer. The first refractive index is greater than the second refractive index and the third refractive index.

20 Claims, 8 Drawing Sheets

MULTILAYER REFLECTIVE STACK FOR REDUCING CROSSTALK IN SPLIT PIXEL IMAGE SENSORS

TECHNICAL FIELD

This disclosure relates generally to image sensors, and, in particular but not exclusively, relates to CMOS image sensors and applications thereof.

BACKGROUND INFORMATION

Image sensors have become ubiquitous and are now widely used in digital cameras, cellular phones, security cameras, as well as medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (e.g., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

Figure 1:
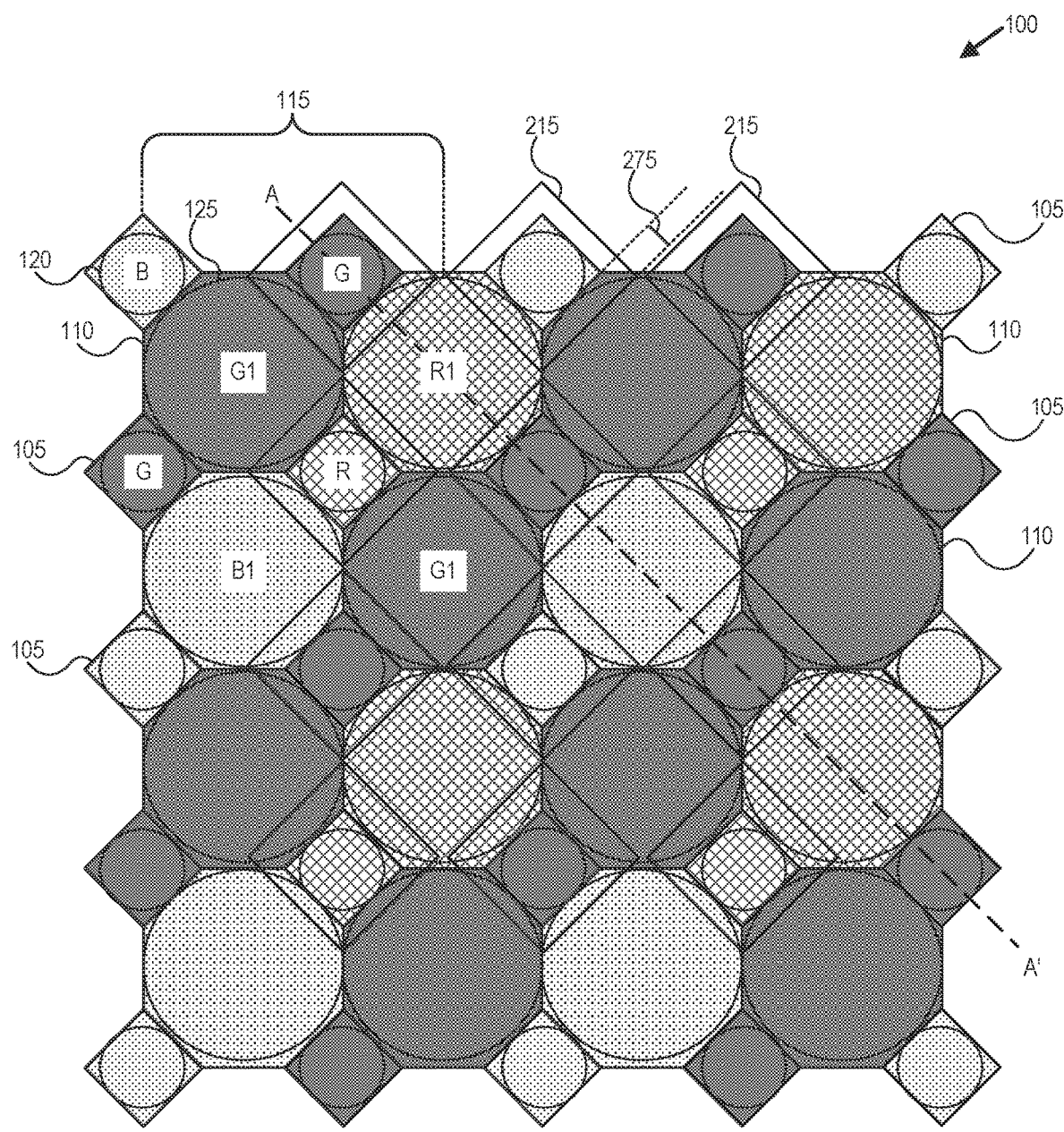
FIG. 1 is a schematic diagram illustrating a top view of an example image sensor including a first pixel and a second pixel, in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures can be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor with a multilayer reflective stack for attenuating crosstalk between neighboring pixels are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Advancements in semiconductor processing techniques have enabled the fabrication of complementary metal oxide semiconductor devices (e.g., image sensors, processors, displays, and the like) with increasingly smaller feature sizes, which has enabled miniaturization of many devices and incorporation of multiple features in a single sensor array. For example, split-pixel image sensors can include two or more types of pixel structures to facilitate high dynamic range imaging in a single sensor. In an illustrative example, small pixel structures can be configured to capture short-exposure information and large pixel structures can be configured to capture long-exposure information, which is particularly advantageous in environments where an image sensor with high dynamic range is desirous (e.g., surveillance, automotive, or other applications where simultaneous imaging of scenes with both bright and dark sources are expected).

Conventional image sensors face several process and performance limitations. Light incident upon an image sensor at an oblique angle may cause crosstalk between adjacent pixels, which can result in imaging artifacts. For example, incident light from bright sources in a dark environment (e.g., oncoming headlights of a vehicle at night) can leak between adjacent pixels, resulting in an image artifact referred to as a petal flare, which may degrade imaging of an external scene or obstruct view of elements within the external scene. Typical approaches for mitigating crosstalk artifacts may reduce quantum efficiency of pixels and impair sensor performance. There is a need, therefore, for image sensors that address the drawbacks of conventional pixel structures.

Embodiments described herein utilize an image sensor including a multilayer reflective stack to provide improved dynamic range in images with reduced or no crosstalk between pixels. As such, the architecture of an image sensor can include a plurality of pixels including first pixels and second pixels, where first photodiodes included in the first pixels may be utilized for shorter-exposure imaging and second photodiodes included in the second pixels may be utilized for longer-exposure imaging (e.g., a global shutter may be utilized such that light collection for both first photodiodes and second photodiodes initialized simultaneously, but exposure duration for the first photodiodes may be less than exposure duration for the second photodiodes). Advantageously, the multilayer reflective stack, in combination with other elements of the image sensor in embodiments described herein, is positioned overlying the first photodiodes to reduce crosstalk by redirecting incident electromagnetic radiation away from the first photodiodes. In this way, embodiments of the present disclosure (e.g., split-pixel image sensors) can operate over a wider dynamic range up to, including, or exceeding 120 dB, while reducing crosstalk and associated image artifacts and without sacrificing quantum efficiency.

Embodiments of the present disclosure include split-pixel image sensors including first pixels and second pixels including multilayer reflective stacks disposed overlying first photodiodes of the first pixel. The multilayer reflective stacks are structured to reduce or eliminate crosstalk between first pixels and second pixels positioned adjacent to one another by, at least in part, inducing internal reflection of a portion of incident electromagnetic radiation within a high-index refractive material (e.g., a first material disposed between a second material and a dielectric layer, the first material having a first refractive index greater than a second refractive index of the second material and a third refractive index of the dielectric layer). In contrast to conventional image sensor configurations, embodiments of the present disclosure may reduce or eliminate the appearance of petal flare and/or other artifacts in images, without coincident loss of quantum efficiency.

In the forthcoming paragraphs multilayer reflective stacks are described that include a "high-index" refractive material and a "low-index" refractive material. In this context, the term "high-index" refers to a material characterized by an index of refraction that is higher than that of the "low-index" refractive material, such that an internal reflection condition is satisfied. To that end, the terms "high" and "low" in connection with indexes of refraction are not absolute measures, but rather indicate relative magnitude that allows light transmitted through the high-index material, being incident on an interface between the high-index material and the low-index material, to be reflected within the high-index material at an angle of incidence above a given angle. It is understood, that the multilayer reflective stacks can function as, but are not limited to, reflectors and/or waveguides, as described in more detail below. Similarly, embodiments of the present disclosure can include dielectric materials that serve as, but are not limited to, reflective surfaces on which multilayer reflective stacks are disposed.

FIG. 1 is a schematic diagram illustrating a top view of an example image sensor 100 including first pixel structures 105 and second pixel structures 110, in accordance with embodiments of the present disclosure. Image sensor 100 is an example of a split-pixel image sensor including two arrays of pixel structures disposed on one or more shared substrates. In the example image sensor 100, first pixel structures 105 are rectangular and disposed in a regular pattern making up a red-green-blue color triad (RGB), such as the Bayer pattern (RGGB, as illustrated). While the first pixel structures 105 are rectangular in example image sensor 100, the first pixel structures 105 can assume triangular, square, trapezoidal, pentagonal, hexagonal, heptagonal, octagonal, rhomboid, or the like, as regular or irregular polygons, based at least in part on the layout of example image sensor 100 and/or on the relative position of first pixel structures 105 in the layout of example pixel sensor 100. Similarly, second pixel structures 110 are octagonal in shape and are laid out in a repeating matrix of four RGGB pixels. While the second pixel structures 110 are octagonal in the example image sensor 100, the second pixel structures 110 can assume triangular, square, trapezoidal, pentagonal, hexagonal, heptagonal, octagonal, rhomboid, or the like, as regular or irregular polygons, based at least in part on the layout of example image sensor 100 and/or on the relative position of second pixel structures 110 in the layout of example pixel sensor 100. It is appreciated that in the illustrated embodiment of FIG. 1, the first pixel structures 105 and the second pixel structures 110 have different shapes and sizes, but in other embodiments the first pixel structures 105 and the second pixel structures 110 may share a common shape, a common size, or both. In some embodiments, a distinction between the first pixel structures 105 and the second pixel structures 110 is a difference in full well capacity and/or light sensitivity. In some embodiments, the first pixel structures 105 (e.g., based on first photodiodes included in the first pixel structures 105) may have a light sensitivity that is less than a light sensitivity of the second pixel structures 110 (e.g., based on second photodiodes included in the second pixel structures 110), which may be achieved by different configurations of light sensing area size and/or amount of light capable of being transmitted toward the first photodiodes. In one embodiment, the first pixel structures 105 (e.g., based on first photodiodes included in the first pixel structures 105) may have a first full well capacity that is less than a second full well capacity of the second pixel structures 110 (e.g., based on second photodiodes included in the second pixel structures 110), which may be achieved by a difference in size, shape, photodiode doping concentration, or combinations thereof. In the same or other embodiments, the first pixel structures 105 may be configured to have less transmissivity of incident light to the underlying first photodiodes relative to the second photodiodes of the second pixel structures 110 (e.g., via an attenuation layer disposed over the first photodiodes that absorbs, blocks, or reflects a portion of light that would otherwise be incident upon first photodiodes).

In the context of example image sensor 100, the term "RGB pixel" refers to a pixel structure (e.g., the first pixel structures 105 or the second pixel structures 110) that is provided with a wavelength-selective filter to generate color information as part of generating visible color images. Discussion of embodiments of the present disclosure focuses on visible wavelength image sensors, but it is contemplated that image sensors can be configured to generate images in other energy spectra, including but not limited to ultraviolet, infrared, x-ray, or the like, where an intense point source of radiation in a dark field could make image generation difficult using a typical image sensor having only one type of pixel structure.

The first pixel structures 105 are arranged to form an array which is interposed between an array of the second pixel structures 110 to collectively form a tessellated array comprising instances of unit cell 115, each of which includes four of the first pixel structures 105 and four of the second pixel structures 110 that are labeled with the color filters 245 (e.g., in reference to FIG. 2A) information (e.g., the group of four of the first pixels 105 labeled as R, G, and B, and the group of four of the second pixels 110 labeled as R1, G1, and B1). In such arrangement, each of the first pixel structures 105 may be surrounded by and adjacent to four of the second pixel structures 110. In unlabeled pixel structures 105 and 110 of the example image sensor 100, the fill pattern denotes the color filter, and it can be seen that the pixel structures are arranged in repeating patterns formed by instances of the unit cell 115. It is appreciated that in some embodiments, the arrangement of color filters is based on other mosaic color patterns such as red-clear-clear-blue, red-green-blue-infrared, red-yellow-yellow-blue, or monochrome patterns, infrared patterns, or a combination thereof. In this way, the term "light" is used to indicate electromagnetic radiation having an energy in ultraviolet, visible, or infrared ranges. In some embodiments, the number, position, size, and shape of first pixel structures 105 and the second pixel structures 110 can differ from what is illustrated. For example, the first pixel structures 105 and the second pixel structures 110 can be distributed differently or otherwise arranged where the energy range to be used as a source of images differs from the full visible spectrum of about 400 nm to about 800 nm.

At least a portion of the first pixel structures 105 include multilayer reflective stacks 215 (e.g., as illustrated in greater detail in FIGS. 2A-2C), configured to attenuate or eliminate crosstalk between the second pixel structures 110 and the first pixel structures 105. Attenuation of crosstalk is based at least in part on inducing an internal reflection condition within one or more high-index refractive materials (e.g., the first material 230 in reference to FIG. 2B) in the multilayer reflective stacks 215. It is appreciated that portions 275 of the multilayer reflective stacks 215 can extend into adjacent and/or nearby second pixel structures 110, a distance of which may be determined at least in part by balancing attenuation of crosstalk artifacts in images generated by example image sensor 100 against reduction in quantum efficiency of second pixel structures 110.

It is appreciated that a ratio of the first pixel structures 105 to the second pixel structures 110 is configurable based on, for example, a target application of the example image sensor 100. Thus, while the unit cell 115 has a one-to-one ratio of the first pixel structures 105 to the second pixel structures 110, embodiments of the disclosure also include smaller and larger ratios. In an illustrative example for monochromatic radiation sensors, including the multilayer reflective stacks 215 of the present disclosure, the number and configuration of color filters can be different. Similarly, for infrared image sensors including the multilayer reflective stacks 215 of the present disclosure, the number and configuration of the first pixel structures 105 and the second pixel structures 110 can be different. In some cases, the number of the first pixel structures 105 or the second pixel structures 110 can be determined based at least in part on the dynamic range expected in the scene to be imaged (e.g., for a special purpose image sensor).

As discussed previously, one difference between the first pixel structure 105 and the second pixel structure 110 is full well capacity, which indicates the amount of charge that can be stored within an individual one of the first pixel structures 105 and the second pixel structures 110 (e.g., based on first photodiodes of the first pixel structure 105 and second photodiodes of the second pixel structures 110) without the pixel becoming saturated. Thus, the first pixel structures 105 include the first photodiodes with a first full well capacity less than a second full well capacity of the second photodiodes included in the second pixel structures 110. The lower full well capacity (i.e., the first full well capacity) of the first pixel structures 105 is suitable for shorter exposure durations, while the higher full well capacity (i.e., the second full capacity) is suitable for longer exposure durations (e.g., relative to the shorter exposure duration). Thus, when imaging an external scene the first pixel structures 105 may be utilized to capture a short exposure duration image while the second pixel structures 110 may be simultaneously utilized to capture a long exposure duration (relative to the short exposure duration) image. The short exposure duration image and the long exposure duration image may then be stitched together to form a high-dynamic range image. Advantageously, the first pixel structures 105 can be configured to detect bright or strong light and second pixel structures 110 can be configured to detect low or dim light.

In some embodiments, the relative size, shape, or number of the first pixel structures 105 and the second pixel structures 110 can differ, for example, where high intensity information is carried by radiation in a first energy range (e.g., reddish) and low intensity information is carried by radiation in a different energy range (e.g., greenish). As an illustrative example, an image sensor configured for use in an automated vehicle system (e.g., self-driving cars) can include smaller or fewer of the second pixel structures 110 for reddish wavelengths, in anticipation of high intensity monochromatic reddish wavelength sources associated with brake lights of motor vehicles. In this way, the specific photoresponse of the first pixel structures 105 and the second pixel structures 110 can be configured for a specific application, based on expected wavelength signatures of interest to be imaged (e.g., based at least in part on a calibrated measurement of vehicle headlights, the example image sensor 100 can be configured to capture less incident blue light from vehicle headlights and more red light from brake lights to reduce the likelihood of the vehicle headlights from saturating pixels of the example image sensor 100).

The first pixel structures 105 and the second pixel structures 110 respectively include microlenses 120 and 125, which are optically aligned over respective photodiodes (see, e.g., FIG. 2A) included in the example image sensor 100 (e.g., photodiodes 210). The microlenses 120 and 125 can be formed of a polymer (e.g., polymethylmethacrylate, polydimethylsiloxane, etc.) or other material and can be shaped to focus, defocus, or otherwise reshape, steer, direct, or modify electromagnetic radiation incident on the microlenses 120 or 125 toward an underlying photodiode (e.g., a microlens 120 is shaped and positioned to direct incident light towards an underlying one of the first photodiodes 210-1 and a microlens 125 is shaped and positioned to direct incident light towards an underlying one of the second photodiodes 210-2)

Figure 2A:
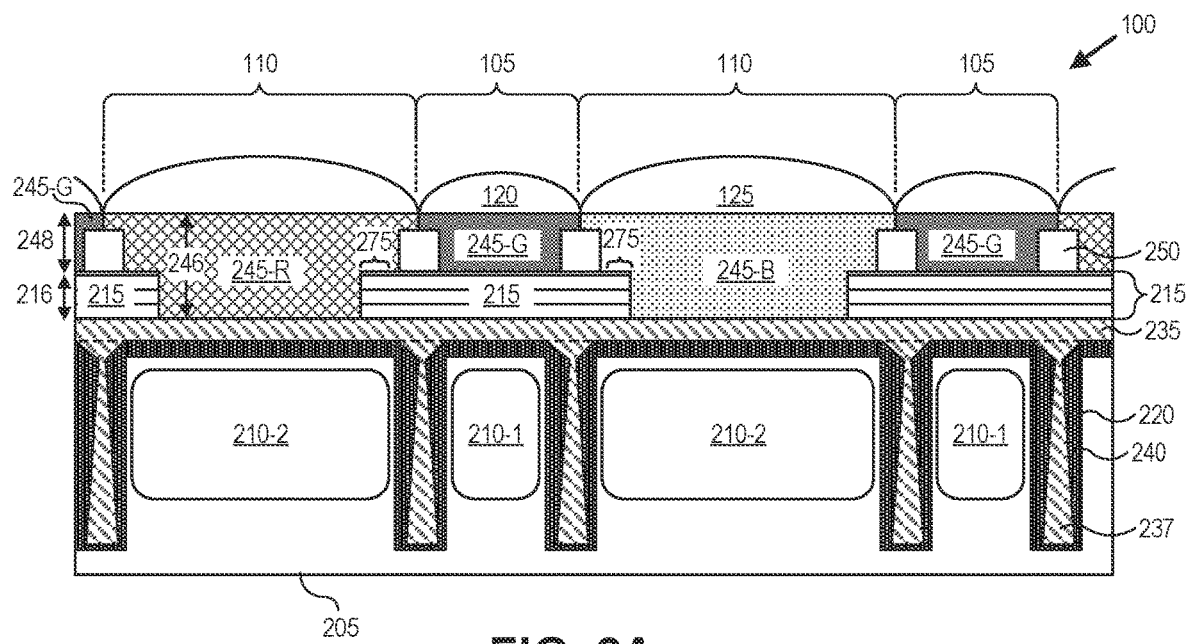
FIG. 2A is a schematic diagram illustrating a section view of the example image sensor of FIG. 1 along section plane AA', in accordance with embodiments of the present disclosure.
Figure 2B:
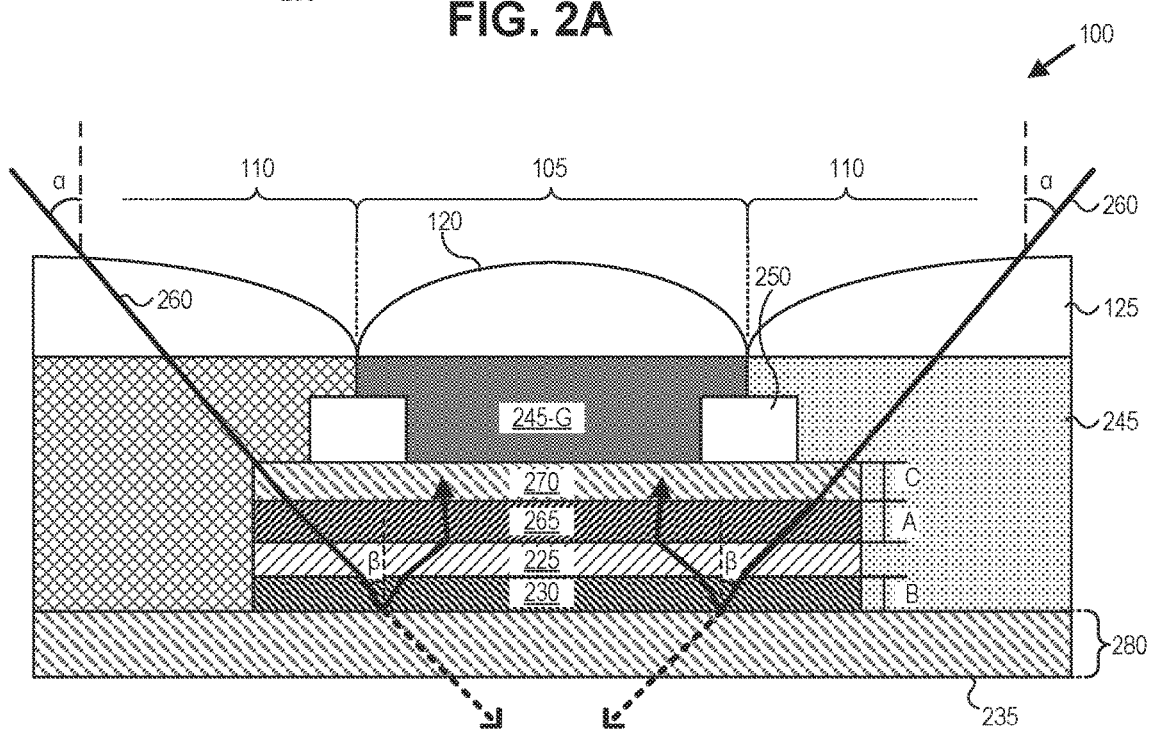
FIG. 2B is a schematic diagram illustrating a detailed view of the section view of FIG. 2A, in accordance with embodiments of the present disclosure.

As part of forming a full color image sensor, the example image sensor 100 illustrated in FIG. 1 can include color filters (e.g., annotated as 'R' or 'R1' for red color filters, 'G' or 'G1' for green filter, and 'B' or 'B1' for blue color filters and labeled in FIGS. 2A-2B as color filters 245) that have a characteristic spectral photoresponse to collective enable full color imaging over a broad energy spectrum of light (e.g., the visible spectrum of electromagnetic radiation, which is approximately 400 nm to 800 nm in wavelength or otherwise corresponds to light that is detectable by the human eye). The term "spectral photoresponse" describes the portion of the electromagnetic spectrum that a respective color filter (e.g., color filter 245-G, 245-B, 245-R of FIG. 2A) transmits. For example, a spectral photoresponse corresponding to green (G) indicates that the color filter is a bandpass filter that transmits a portion of the electromagnetic spectrum corresponding to greenish light while substantially absorbing or reflecting other portions of the electromagnetic spectrum outside of a given passband for greenish light (e.g., about 520 nm to about 560 nm). Similarly, a spectral photoresponse corresponding to panchromatic or wide-band indicates that the color filter substantially transmits a portion of electromagnetic spectrum corresponding to the visible spectrum of light while substantially absorbing or reflecting regions of the electromagnetic spectrum outside of the visible range (e.g., ultraviolet, infrared, etc., where the photodiode has spectral photoresponse outside of the visible range). In some embodiments, the spectral photoresponse for blue, green, red, and wide-band color filters correspond to frequency ranges within the electromagnetic spectrum of approximately 450 nm to 490 nm, 520 nm to 560 nm, 635 nm to 700 nm, and 400 nm to 700 nm, respectively. In some embodiments, the plurality of color filters (e.g., the color filters 245 illustrated in FIG. 2A-2C) included in the first pixel structures 105 and the second pixel structures 110 exhibit a spectral photoresponse corresponding to any one of red, green, blue, panchromatic (e.g., clear or white), infrared, yellow, cyan, magenta, or other colors, individually or in combination.

It is appreciated that the example image sensor 100 can be fabricated by semiconductor device processing and CMOS-compatible microfabrication techniques known by one of ordinary skill in the art. In one embodiment, fabrication of example image sensor 100 can include providing a semiconductor substrate (e.g., a wafer or substrate comprising silicon, a silicon germanium alloy, germanium, a silicon carbide alloy, an indium gallium arsenide alloy, any other alloys formed of III-V group compounds, combinations thereof, or a bulk substrate thereof) having a front side and a back side, forming a mask or template (e.g., made of cured photoresist) on the front side or the backside of the semiconductor substrate via photolithography to provide a plurality of exposed regions, doping (e.g., via ion implantation, chemical vapor deposition, physical vapor deposition, and the like) the exposed portions of the semiconductor material to form photodiodes within the semiconductor substrate, removing the mask or template (e.g., by dissolving the cured photoresist with a solvent, a wet etch, a dry etch, or combinations thereof), and planarizing (e.g., via chemical mechanical planarization or polishing) the semiconductor substrate. In the same or another embodiment, photolithography can be similarly used to form constituent elements of the example image sensor 100, such as color filters (e.g., the color filters 245 illustrated in FIGS. 2A-2C, which may correspond to cured pigmented polymers having a desired spectral photoresponse), microlenses (e.g., the microlenses 120 and 125 illustrated in FIG. 2A-2C, which may correspond to polymer based microlenses having a target shape and size formed from a master mold or template), and isolation structures (e.g., metal grids or lines structured or otherwise deposited to block or reduce crosstalk between adjacent pixel structures such as first pixel structures 105 adjacent to second pixel structures 110). It is appreciated that the described techniques are merely demonstrative and not exhaustive and that other techniques can be utilized to fabricate one or more components of the example image sensor 100.

FIG. 2A is a schematic diagram illustrating a cross-sectional view along line A-A' of the example image sensor 100 shown in FIG. 1, in accordance with embodiments of the present disclosure. Specifically, the cross-sectional view illustrates a section including two instances of the first pixel structures 105 and two instances of the second pixel structures 110. The illustration in FIG. 2A is intended to focus description on multilayer reflective stacks 215. As such, FIG. 2A omits elements of the example image sensor 100 in the interest of clarity and ease of explanation. For example, section views of FIGS. 2A-2C omit metal layers, interconnects, and other electronic components that are understood to form a part of an operative image sensor, to focus description on optical aspects of the example image sensor 100 and attenuation structures that impart improved attenuation of crosstalk artifacts.

The example image sensor 100 includes microlenses 120, microlenses 125, a semiconductor substrate 205, a plurality of photodiodes 210 (e.g., first photodiodes 210-1 and second photodiodes 210-2), multilayer reflective stacks 215, one or more isolation structures 220, dielectric layer 235, and color filters 245 (e.g., red color filters 245-R, green color filters 245-G, and blue color filters 245-B), which collectively form the first pixel structures 105 and the second pixel structures 110. As illustrated, the plurality of photodiodes 210 disposed within the semiconductor substrate 205 are separated from one another by the one or more isolation structures 220. The dielectric layer 235 is disposed between the multilayer reflective stack 215 and the plurality of photodiodes 210, including the first photodiodes 210-1 and the second photodiodes 210-2. More specifically the first photodiodes 210-1 of the first pixel structures 105 are covered by the multilayer reflective stacks 215 (e.g., the multilayer reflective stacks 215 are optically aligned with the first photodiodes 210-1) while the second photodiodes 210-2 of the second pixel structures 110 are only partially covered by the multilayer reflective stacks 215 (e.g., the dielectric layer 235 is disposed between portions 275 of the multilayer reflective stack 215 and the second photodiodes 210-2). In other words, the multilayer reflective stacks 215 are optically aligned with an underlying one of the first photodiodes 210-1 and laterally extend over an adjacent one of the second photodiodes 210-2 such that the dielectric layer 235 is disposed between one of the portion 275 of the multilayer reflective stack 215 and the adjacent one of the second photodiodes 210-2.

In embodiments of the disclosure, the semiconductor substrate 205 may include silicon, a silicon germanium alloy, germanium, a silicon carbide alloy, an indium gallium arsenide alloy, alloys formed of III-V compounds, other semiconductor materials or alloys, combinations thereof, a substrate thereof, a bulk substrate thereof, or a wafer thereof. In some embodiments, a gap is defined between neighboring or adjacent photodiodes included in the plurality of photodiodes 210 (e.g., between one of the first photodiodes 210-1 adjacent to one of the second photodiodes 210-2), such that additional structures can be formed in the gaps to improve performance of image sensors (e.g., isolation structures, floating diffusion, pixel transistors, or the like). As illustrated, the one or more isolation structures 220 are disposed between adjacent pairs of the plurality of photodiodes 210. In some embodiments, the one or more isolation structures 220 may correspond or otherwise include shallow trench isolation structures, deep trench isolation structures, or combinations thereof.

The dielectric layer 235 is disposed between the multilayer reflective stacks 215 and semiconductor substrate 205. In some embodiments, the dielectric layer 235 may include or otherwise correspond to a planarized buffer layer, which may be formed of silicon oxide for protecting underlying material layers as well as a surface of the semiconductor substrate 205 during process. The dielectric layer 235 may further provide stress relief for stress associated with chemical mechanical polishing and/or stress relief associated with stress incurred during the formation of the plurality of pixel structures 105, 110. As illustrated, the dielectric layer 235 is disposed overlying semiconductor substrate 205 and may form a part of the one or more isolation structures 220. For example, during fabrication, one or more trenches are formed within the semiconductor substrate 205 and filled with at least one of an inner material 237 (e.g., the corresponding material or materials utilized to form the dielectric layer 235 and/or one or more different materials such as silicon dioxide, reflective material such as aluminum, or conductive material such as polysilicon or tungsten, or combinations thereof) or a liner 240 (e.g., one or more materials that line or fill trenches formed within the semiconductor substrate 205 that are to correspond to or otherwise form the one or more isolation structures 220). In some embodiments (e.g., where the inner material 237 and the dielectric layer 235 are formed of a common material), one or more shared processing steps may be utilized to simultaneously fill the trenches with the inner material 237 while also forming the dielectric layer 235. It is appreciated that the one or more isolation structures 220 may, at least in part, mitigate or otherwise reduce optical and/or electric crosstalk between the first pixel structures 105 and the second pixel structures 110, which in combination with the multilayer stacks 215 provide enhanced crosstalk mitigation. In some embodiments, the inner material 237 that fills the trenches for forming the one or more isolation structures 220 may include an oxide-based material (e.g., silicon dioxide). As illustrated, trenches can be first partially filled with the liner 240 (e.g., one or more high-κ materials such as hafnium oxide, aluminum oxide, tantalum oxide, other high-κ materials, or a combination thereof) to serve as a passivation layer, diffusion barrier, and/or an antireflective coating. After the formation of the liner 240, the trenches may subsequently be filled with the inner material 237, which may correspond to the same material that forms the dielectric layer 235. In other embodiments, the one or more isolation structures 220 may be formed followed by subsequent deposition to form the dielectric layer 235. In some embodiments, the dielectric layer 235 may have a refractive index lower than that of the semiconductor substrate 205 and/or the liner 240.

The one or more high-κ dielectric materials that form the liner 240 can at least partially conform to the sidewalls and bottom of the trenches when forming the one or more isolation structures 220. In some embodiments, the one or more high-κ dielectric materials that form the liner 240 can be extended over the semiconductor substrate 205 continuously, for example, coating a front or backside of the semiconductor substrate 205. In an illustrative example, the one or more high-κ dielectric materials that form the liner 240 can be used as part of an antireflective coating on the semiconductor substrate 205 and an overall thickness of a portion of the liner 240 outside of the one or more isolation structures 220 (e.g., portions of the liner that coat the front or backside of the semiconductor substrate 205) can be thicker than a lining thickness on a sidewall or a bottom surface within the one or more isolation structures 220. Advantageously, a larger thickness can improve a light transmittance coefficient to reduce reflections of incoming light that penetrates through the surface of the semiconductor substrate 205 to be absorbed in the plurality of photodiodes 210. It is appreciated that the one or more isolation structures 220 that can reduce electrical and/or optical crosstalk between the plurality of photodiodes 210 may be formed in a grid manner that individually surrounds the plurality of photodiodes 210 (e.g., each photodiode included in the plurality of photodiodes 210 may be isolated and surrounded by the one or more isolation structures 220). As illustrated, the one or more isolation structures 220 extend a depth into the semiconductor substrate 205 beyond a depth of the plurality of photodiodes 210 (e.g., to form deep trench isolation structures). In some embodiments, additional shallow trench isolation structures may be included in the one or more isolation structures 220 that extend into the semiconductor substrate 205 for a portion of the depth of the plurality of photodiodes 210, which may provide isolation between the plurality of photodiodes 210 and pixel transistors (e.g., source-follower, row select, or reset transistors). In some embodiments, the one or more isolation structures 220 are omitted or are otherwise not disposed between at least a portion of the plurality of photodiodes 210.

As illustrated, each one of the first pixel structures 105 includes one of the first photodiodes 210-1 and each one of the second pixel structures 110 includes one of the first photodiodes 210-2. The first photodiodes 210-1 can be configured to detect bright light and the second photodiodes 210-2 can be configured to detect low light (e.g., via different exposure durations for the first photodiodes 210-1 and the second photodiodes 210-2). The first photodiodes 210-1 and the second photodiodes 210-2 can have different light sensing characteristics, which may be achieved based on size, shape, doping concentration, or otherwise. In one example, the first photodiodes 210-1 may be physically smaller than the second photodiodes 210-2 (e.g., a first light exposure area of the first photodiodes 210-1 is less than a second light exposure area of the second photodiodes 210-2). In the same or another example, the first photodiodes 210-1 can have a light sensitivity less than that of the second photodiodes 210-2 (e.g., based on a difference in structure between the first pixel structures 105 and the second pixel structures 110). In the same or a further example, a first full well capacity of the first photodiodes 210-1 or the first pixel structures 105 is configured to be less than a second full well capacity of the second photodiodes 210-2 or the second pixel structures 110. However, it is appreciated that in other examples, the first photodiode 210-1 can be configured to have a larger charge storage capacity than that of the second photodiode 210-2.

The example image sensor 100 also includes multilayer reflective stacks 215 disposed over the dielectric layer 235 to cover a light exposure area of first photodiodes 210-1 (i.e., the dielectric layer 235 is disposed between the first photodiodes 210-1 and the multilayer reflective stacks 215). As described in more detail in reference to FIG. 2B, the multilayer reflective stacks 215 include a first material 230 having a first refractive index and a second material 225 having a second refractive index. The dielectric layer 235 has a third refractive index. It is appreciated that the first material 230 is disposed between the second material 225 and the dielectric layer 235. In some embodiments, the first refractive index of the first material 230 is greater than the second refractive index of the second material 225 and the third refractive index of the dielectric layer 235. In the illustrated embodiment of FIG. 2A, portions 275 of the multilayer reflective stacks 215 extend beyond covering the first photodiodes 210-1 such that the dielectric layer 235 is disposed between the portions 275 and the second photodiodes 210-2.

As illustrated, the multilayer reflective stacks 215 overlies at least a portion of a light exposure area of second photodiodes 210-2. More specifically, the multilayer reflective stacks 215 are each optically aligned with a respective one of the first photodiodes 210-1. In some embodiments, each of the multilayer stacks 215 laterally extends over an adjacent one or more of the second photodiodes 210-2 such that the dielectric layer 235 is disposed between portions 275 of the multilayer reflective stacks 215 and the second photodiodes 210-2. In the same or other embodiments, a distance the portions 275 of the multilayer reflective stacks 215 extend over from a periphery of one of the second photodiodes 210-2 toward a center of the one of the second photodiodes 210-2 is about 0.5%, about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, or about 25% of the width of second photodiodes 210-2, including fractions and interpolations thereof. In this way, a distance, size, or length of the portions 275 can be expressed as a double-bounded range, from about 0.5% to about 25%, from about 0.5% to about 20%, from about 0.5% to about 15%, from about 0.5% to about 10%, from about 0.5% to about 5%, or from about 0.5% to about 1%, including fractions and interpolations thereof. In this context, the term "about" refers to variation of the stated value of +10%. The extent the portions 275 of the multilayer stacks 215 extend over or otherwise cover the second photodiodes 210-2 represents a balance of opposing factors, where a larger distance reduces crosstalk between the first photodiodes 210-1 and the second photodiodes 210-2 at the expense of a reduced quantum efficiency for the second photodiodes 210-2. As such, when the portions 275 extend a distance corresponding to an extent over about 15% of the width of the underlying one of the second photodiodes 210-2, quantum efficiency may be detrimentally affected. Correspondingly, when the portions 275 extend a distance corresponding to an extent over about 5% of the width of the underlying one of the second photodiodes 210-2, crosstalk attenuation between the first photodiodes 210-1 and the second photodiodes 210-2 may be reduced.

The example image sensor 100 includes the plurality of photodiodes 210 arranged in a regular, repeating manner such that the plurality of photodiodes 210 are formed or otherwise disposed in semiconductor substrate 205 as one or more doped regions within respective portions of the semiconductor material that are responsive to incident electromagnetic radiation. The doped regions can form a PN junction that generates image charge proportional to a magnitude or intensity of the incident electromagnetic radiation. It is appreciated that the plurality of photodiodes 210 are disposed within the semiconductor substrate 205 and can be optically aligned with respective color filters (e.g. 245-B, 245-G, or 245-R) as part of the first pixel structures 105 and the second pixel structures 110. In some embodiments, there may be a spacing and/or a separation distance between adjacent elements included in the plurality of photodiodes 210, microlenses 120, microlenses 125, and/or color filters 245 in accordance with embodiments of the disclosure. Further still, in some embodiments, other components (e.g., vias, wiring, circuitry, isolation trenches such as the one or more isolation structures 220, and the like) can be disposed within the spacing.

The example image sensor 100 further includes the color filters 245 and metal grid structure 250. The color filters 245 are disposed overlying the dielectric layer 235, which may correspond to a buffer oxide layer, and are individually aligned with a respective one of the plurality of photodiodes 210, as described in more detail in reference to FIG. 1. In the illustrated embodiment of FIG. 2A, a first color filter (e.g., one of the color filters 245 labeled as 245-G, or any other one of the color filters 245 disposed over a corresponding one of the first photodiodes 210-1) is optically aligned with a first photodiode (e.g., the corresponding one of the first photodiodes 210-1) such that the multilayer reflective stack (i.e., one of the multilayer reflective stacks 215) is disposed between the first photodiode and the first color filter. The illustrated embodiment further shows a second color filter (e.g., one of the color filters 245 labeled as 245-R, 245-B, or any other one of the color filters 245 disposed over a corresponding one of the second photodiodes 210-2) optically aligned with the second photodiode (e.g., the corresponding one of the second photodiodes 210-2) such that the first color filter is adjacent to the second color filter. Additionally, at least a portion of the second color filter is thicker than the first color filter due, at least in part, to a thickness of the multilayer reflective stack (e.g., a thickness 246 of the color filter 245-R is greater than a thickness 248 of the color filter 245-G due, at least in part, to a thickness 216 of the underlying one of the multilayer reflective stacks 215). Disposed between the first color filter and the second color filter (e.g., color filter 245-G adjacent to color filter 245-R or 245-B) are metal grid structures 250. In other words, in some embodiments, second color filters included in the color filters 245 correspond to color filters optically aligned with the second photodiodes 210-2 while first color filters included in the color filters 245 correspond to color filters optically aligned with the first photodiodes 210-1. In some embodiments, at least a portion of the second color filters are thicker than the first color filters due, at least in part, to the thickness of the multilayer reflective stack that extends entirely under the first color filters without extending entirely under the second color filters.

The metal grid structure 250 can be deposited over the multilayer reflective stacks 215 (e.g., with direct or indirect contact to the multilayer stacks 215) and be substantially aligned with the one or more isolation structures 220. As part of fabrication, as described in more detail in reference to FIGS. 4A-F, constituent structures of the example image sensor 100 can be planarized following deposition (e.g., by chemical mechanical polishing or other planarizing technique) such that material layer positions, thicknesses, and alignments are preserved. For example, the color filters 245 can be planarized following deposition, such that the microlenses 120 and 125 can be disposed on a substantially planar surface. It is appreciated that the term "substantially" in this context refers to a surface that is planar within allowable tolerances for image sensor applications.

FIG. 2B is a schematic diagram illustrating a detailed view of the section view of FIG. 2A, in accordance with embodiments of the present disclosure. FIG. 2B illustrates the relative arrangement of constituent layers of one of the multilayer reflective stacks 215, which includes a first material 230 (e.g., a high-index refractive material) and a second material 225 (e.g., a low-index refractive material) and the interaction of the constituent layers with incident radiation 260 in the context of inducing internal reflection at a boundary between first material 230, the second material 225, and the dielectric layer 235. It is appreciated that the first material 230 has a first refractive index, the second material 225 has a second refractive index, and the dielectric layer 235 has a third refractive index. More specifically, the first refractive index of the first material 230 is greater than the second refractive index of the second material 225 and the third refractive index of the dielectric layer 235. In some embodiments, the multilayer reflective stacks 215 each include an attenuation layer 265 disposed overlying second material 225 (e.g., the second material 225 is disposed between the first material 230 and the attenuation layer 265)

for reducing or attenuating incident light whether being directed to the first photodiodes 210-1 by the microlenses 120 through absorption and/or reflection or crosstalk from an adjacent photodiode (e.g., one of the second photodiodes 210-2 included in second pixel structures 110). In some embodiments, the multilayer reflective stacks 215 further include an insulation layer 270 overlying attenuation layer 265 (e.g., the attenuation layer 265 is disposed between the second material 225 and the insulation layer 270). In some embodiments, the attenuation layer 265 can have a greater thickness (e.g., 'A') than a corresponding thickness of the first material 230 (e.g., 'B'). In the same or other embodiments, the attenuation layer 265 can have a greater refractive index than the second refractive index of the second material 225.

Petal flare, x-flare, and other crosstalk artifacts in images generated by image sensors can result from incident light 260 entering the second pixel structures 110 at an angle of incidence α with respect to an axis normal to the surface of the semiconductor substrate 205 (not illustrated in FIG. 2B, but the surface such as the first side or the backside of the semiconductor substrate 205 is planar with at least one of the dielectric layer 235, the first material 230, the second material 225, the attenuation layer 265, and/or the insulation layer 270) that is greater than or equal to about 30°, about 31°, about 32°, about 33°, about 34°, about 35°, about 36°, about 37°, about 38°, about 39°, about 40°, about 41°, about 42°, about 43°, about 44°, about 45°, about 46°, about 47°, about 48°, about 49°, about 50°, about 51°, about 52°, about 53°, about 54°, about 55°, about 56°, about 57°, about 58°, about 59°, or about 60, including fractions and interpolations thereof (e.g., the incident light 260 may enter the second pixel structures 110 at an oblique angle such about 45°-50° and reach an underlying photodiode associated with an adjacent one of the first pixel structures 105). In this context, the term "about" refers to variation of the stated value of +10%.

To that end, the multilayer reflective stacks 215 can be structured to redirect the incident light 260 that is incident on the image sensor for an angle or range of angles of incidence for a being greater than or equal to a specific angle of incidence (e.g., 45°-50°, which may correspond to a threshold angle or threshold range of angles, by configuring an associated critical angle or range of critical angles for angles of incidence "B" of the incident light 260 with respect to an axis normal to a surface of the first material 230 (e.g., the high-index refractive material) to induce total internal reflection where the first material 230 interfaces with the dielectric layer 235. The angle β is related to the angle of incidence α of incident light 260. The angle β may be smaller than the angle of incidence α of incident light 260. The angle β can be determined at least in part by simulation and/or experiment, from which the materials of composition and dimensions of the multilayer reflective stack 215 can be configured. In other words, the multilayer stacks 215 are configured to internally redirect oblique light incident on the image sensor (e.g., the incident light 260) from entering the underlying first photodiodes 210-1 when the point of entry is above the second photodiodes 210-2 (e.g., in reference to FIG. 2A), to prevent crosstalk (and the resultant image artifacts such as petal flare) between the first pixel structures 105 and the second pixel structures 110. In an illustrative example, incident light 260 at an angle of incidence α being greater than or equal to about 40 degrees may result in significant crosstalk between photodiodes of the first pixel structures 105 and the second pixel structures 110, which can be used to determine the critical angle or range of critical angles for β (e.g., to enforce total internal reflection for incident light a greater than a threshold angle or within a threshold range of angles). Once the critical angle or a range of critical angles for β is determined as described above, the first material 230 can be determined or otherwise selected using Snell's law such that there is total internal reflection at the interface of the first material 230 and the dielectric 235 when the incident light 260 is equal to or greater than the critical angle or range of critical angles for β. In other words, the multilayer reflective stacks 215 can be configured such that for a exceeding a threshold angle or range of angles of a (e.g., oblique angles known to result in crosstalk between adjacent pixels), the components of the multilayer reflective stacks 215 may be selected to induce total internal reflection for a critical angle or range of angles for β, which is directly related to the composition of the multilayer reflective stacks 215 and the angle of incident α. The expression for $n_2$ using Snell's law is:

$$n_i \geq \frac{n_r \sin\Theta_r}{\sin\Theta_i}.$$

To find the critical angle or range of critical angles where the incident light 260 will be reflected at the interface where the first material 230 meets the dielectric layer 235, the aforementioned Snell's law may be used where $n_i$ is the incident index (e.g., the first refractive index of the first material 230), $n_r$ is the refracted index (e.g., the third refractive index of the dielectric layer 235), $\Theta_i$ is the incident angle of the incident light 260 (e.g., which can be determined using Snell's law based on the critical angle "β" or otherwise be determined experimentally or through simulations) entering the material associated with $n_i$ (e.g., the first material 230), and $\Theta_r$ is the refracted angle associated with $n_i$ (e.g., the dielectric layer 235). It is appreciated that total internal reflection only occurs when light is entering into a less dense medium, thus $n_i$ must be greater than $n_r$ (e.g., the first refractive index of the first material 230 is greater than the third refractive index of the dielectric layer 235). For total internal reflection, $\Theta_r$ is assigned a value of 90 degrees and $\Theta_i$ can be determined from experiment and/or simulation of optical crosstalk (e.g., via optical simulation using Snell's law based on the critical angle "β" and the composition of the constituent components of the first pixel structures 105 and the second pixel structures 110 such as, but not limited to the insulation layer 270, the attenuation layer 265, and the second material 225). In some embodiments, it is desired to reflect the incident light 260 when the angle of incidence "α" is greater than or equal about 40 degrees, about 45 degrees, about 50 degrees above, or otherwise to mitigate crosstalk between the first pixel structures 105 and the second pixel strictures 110. Using Snell's law, optical simulations, or experimental data, the appropriate first material 230 can be chosen based on the critical angle or critical range of angles for β of the incident light 260 formed with respect to an axis normal to a surface of the first material 230, which is designed based on the target angle of incidence range associated with the incident light 260 (e.g., angle of incidence α) such that total internal reflection occurs at the interface where the first material 230 meets the dielectric layer 235. That is, the first material 230 can be selected such that incident light 260 with an incident angle being greater or equal to the target incident angle threshold (e.g., α greater than or equal to the target incident angle threshold) would be reflected before reaching the first photodiode 210-1 of the first pixel structures 105.

In some embodiments and in reference to the example image sensor 100, $n_i$ corresponds to the first refractive index of the first material 230 and $n_r$ corresponds to the third refractive index of the dielectric layer 235. In an illustrative example, β can be 45 degrees and $n_r$ can be 1.45 (corresponding to silicon dioxide), which using the above equation can be used to determine that $n_i$ is greater than or equal to about 2.05. In this way, a range of values of β from about 35 degrees to about 60 degrees, the value of $n_i$ ranges from about 1.67 to about 2.53. In some embodiments, therefore, the first refractive index of the first material 230 is characterized as greater than or equal to about 1.60, about 1.65, about 1.70, about 1.75, about 1.80, about 1.85, about 1.90, about 1.95, about 2.00, about 2.05, or about 2.10, including fractions or interpolations thereof. In this context, the term "about" refers to variation of the stated value of ±10%.

In some embodiments, a ratio of the first refractive index of the first material 230 to the second refractive index of second material 225 and/or a ratio of the first refractive index of the first material 230 to the third refractive index of the dielectric layer 235 is from about 1.1 to about 1.8. For example, the ratio of the indexes of refraction can be from about 1.1 to about 1.8, from about 1.2 to about 1.8, from about 1.3 to about 1.8, from about 1.4 to about 1.8, from about 1.5 to about 1.8, from about 1.6 to about 1.8, from about 1.7 to about 1.8, from about 1.1 to about 1.7, from about 1.1 to about 1.6, from about 1.1 to about 1.5, from about 1.1 to about 1.4, from about 1.1 to about 1.3, or from about 1.1 to about 1.2, including fractions and interpolations thereof. For example, the ratio can be about 1.45, about 1.55, or the like, based at least in part on the composition of the dielectric layer 235 and/or the critical angle for β to induce internal reflection within the first material 230. While the internal reflection condition is generally satisfied for values of the ratio equal to or above a critical angle for angle β of incident light 260, material selection is limited by the double-bounded ranges at least in part due to limitations with manufacturability, in that values of the ratio above 1.8 can be physically incompatible with CMOS-compatible fabrication systems. For example, a material having an index of refraction above 2.5 can be incompatible with a CMOS deposition-etch system.

In some embodiments, the first material 230 may be selected such that for values of angle of incident α equal to or greater than about 55 degrees, incident light 260 can be redirected, absorbed, and/or reflected away from the dielectric layer 235, thus away from first photodiode 210-1 by the metal grid structure 250, the microlenses 120, the microlenses 125, or other constituent elements of the example image sensor 100. Correspondingly, for values of a below about 35 degrees, incident radiation 260 can be unlikely or unable to transit from the second pixel structures 110 to the underlying photodiodes in an adjacent one of the first pixel structures 105 based at least in part on dimensional or geometric factors, optical elements such as the microlenses 125, as well as absorption and/or reflection by the one or more isolation structures 220. In this way, the first refractive index of the first material 230 can be characterized as being about 1.85 to about 2.10. In an illustrative example, the first material 230 can be or include titanium, tantalum oxide, silicon nitride, or other materials, or a combination thereof, that are at least partially translucent to incident light 260, which may have a corresponding refractive index (i.e., the first refractive index) from about 1.85 to about 2.10 for the energy spectrum of the incident light 260.

In addition to inducing a total internal reflection condition, the dimensions of the first material 230 can facilitate path-length dependent absorption of incident light 260. For example, the first material 230 can be characterized by a thickness that absorbs at least a portion of incident light 260. In this way, the first material 230 can be characterized by a thickness B from about 30 Angstroms to about 300 Angstroms (Å). For example, the thickness B of the first material 230 can be about 30 Å, about 40 Å, about 50 Å, about 60 Å, about 70 Å, about 80 Å, about 90 Å, about 100 Å, about 110 Å, about 120 Å, about 130 Å, about 140 Å, about 150 Å, about 160 Å, about 170 Å, about 180 Å, about 190 Å, about 200 Å, about 210 Å, about 220 Å, about 230 Å, about 240 Å, about 250 Å, about 260 Å, about 270 Å, about 280 Å, about 290 Å, or about 300 Å, including fractions and interpolations thereof. While an absorptive layer can improve attenuation of incident light 260 and reduce crosstalk artifacts, above a given thickness quantum efficiency of second photodiodes 210-2 may be adversely affected, based at least in part on the absorbance of the material to the energy of incident light 260. Below a given thickness the effectiveness of first material 230 as an internal reflection medium is impaired, for example, where deposition processes become imprecise and the layer loses conformality. In some embodiments, the first material 230 is characterized by thickness B from about 50 Angstroms to about 150 Angstroms. In this context, the term "about" refers to variation of the stated value of ±10%.

In the same or other embodiments, the second material 225 and/or the dielectric layer 235 can correspond to $n_r$ when using Snell's law and be or include a material characterized by an index of refraction (e.g., the second refractive index of the second material 225 or the third refractive index of the dielectric layer 235) that is lower than that of first refractive index of the first material 230. In some embodiments, the second refractive index of the second material 225 and/or the third refractive index of the dielectric layer 235 is from about 1.0 to about 1.8. For example, the second material 225 and/or the dielectric layer 235 can be silicon dioxide. The second refractive index of the second material 225 and/or the third refractive index of the dielectric layer 235 can be about 1.00, about 1.05, about 1.10, about 1.15, about 1.20, about 1.25, about 1.30, about 1.35, about 1.40, about 1.45, about 1.50, about 1.55, about 1.60, about 1.65, about 1.70, about 1.75, or about 1.80, including fractions and interpolations thereof. As previously described, the first material 230, the second material 225, the dielectric layer 235, and the critical angle β are coupled through Snell's law for internal reflection. To that end, a higher value of $n_r$ (corresponding to the second material 225 and/or the dielectric layer 235) corresponds to a higher value of $n_i$ (e.g., the first material 230) for a given value of the critical angle β. In an illustrative example, for a target value of α of 50 degrees, $n_i$ may be selected to range from about 1.15 to about 2.05 for the stated range of values of $n_r$ given above. In this way, the selection of materials for the multilayer reflective stacks 215 can be based at least in part on the configuration of the example image sensor 100, the intended application of example image sensor 100, and/or the deposition system employed to fabricate example image sensor 100.

It is appreciated that the multilayer reflective stack 215 is configured to have the first material 230 sandwiched between the second material 225 and dielectric layer 235 and further configured for the first material 230 to have the first refractive index being greater than the second refractive index of the second material 225 and the third refractive index of the dielectric layer 235. In such a configuration, and in some embodiments, the multilayer reflective stack 215 (e.g., including the first material 230 and the second material 225) in combination with the dielectric layer 235 may function as a waveguide directing at least a portion of incident light 260 through the first material 230 toward an adjacent second photodiode 210-2 of the second pixel structure 110. In one example, when the incident light 260 directed enters the first material 230 with an angle of incidence α with respect to an axis normal to a surface of the first material 230 that results in B being greater than the critical angle that result in total internal reflection within the first material 230, then the incident light 260 may enter and be confined within the first material 230 and propagate through the first material 230 in a confined manner until exiting the multilayer reflective stack 215 away from the first pixel structure 105 and towards the second pixel structure 110. In such an embodiment, the "waveguide" mitigates incident light intended for the second pixel structures 110 from reaching the first pixel structures 105 (e.g., optical crosstalk between the second photodiodes 210-2 and the first photodiodes 210-1 is mitigated).

It is further appreciated that in some embodiments the second refractive index of the second material 225 is substantially equivalent (e.g., within 10%, 5%, or less) to the third refractive index of the dielectric layer 235. However, in other embodiments, the second refractive index of the second material 225 and the third refractive index of the dielectric layer 235 are not equivalent while both the second refractive index and the third refractive index are less than the first refractive index of the first material 230.

As previously described, the attenuation layer 265 can be disposed overlying the second material 225. More specifically, the attenuation layer 265 is disposed between the microlenses 120 and the multilayer reflective stacks 215. The attenuation layer 265 can be or include titanium, titanium nitride, silicon nitride, or other materials selected to absorb at least a portion of incident radiation 260. In some embodiments, the attenuation layer 265 includes at least one layer of one or more materials, which may be stacked in a regular or repeating manner. For example, in one embodiment, the attenuation layer 265 may include layers of titanium and titanium nitride to form a Ti/TiN stack. In some embodiments, the attenuation layer 265 may be formed of multiple stacks of layers (e.g., multiple Ti/TiN stacks). In some embodiments, the attenuation layer 265 can be characterized by an index of refraction that is greater than that of the second refractive index of the second material 225 and/or the third refractive index of the dielectric layer 235. In this way, where insulation layer 270 is disposed overlying attenuation layer 265, internal reflection can conduct a portion of reflected incident light 260 away from underlying first photodiodes 210-1. The attenuation layer 265 can be characterized by a thickness A that is greater than or equal to thickness B of first material 230. To that end, the thickness A can range from about 50 Angstroms to about 300 Angstroms, or greater, being based at least in part on quantum efficiency constraints of first photodiodes 210-1, for example. In an illustrative example, the attenuation layer 265 can be or include titanium, such that the thickness A can be about 200 Angstroms or less. In another example, the attenuation layer 265 can be or include titanium nitride, for which the thickness A can be about 100 Angstroms or less. In some embodiments, the attenuation layer 265 includes a layer of titanium and a layer of titanium nitride, such that the thickness A is about 300 Angstroms or less. It is appreciated that when the attenuation layer 265 includes a layer of titanium and a layer of titanium nitride, a thickness of the titanium layer may be greater than a thickness of the titanium nitride layer. Further still, the layer of the titanium nitride layer may be disposed between the layer of the titanium layer and the second material 225. In some embodiments, the layer of the titanium nitride may correspond to a metal diffusion barrier layer to mitigate diffusion of titanium into the second material 225.

In the illustrated embodiment, the insulation layer 270 is disposed between an overlying one of the color filters 245 (e.g., a first color filter such as color filter 245-G) and one of the multilayer reflective stacks 215 (e.g., the first material 230, the second material 225, and/or the attenuation layer 265). Additionally in the illustrated embodiment, the attenuation layer 265 is disposed between the insulation layer 270 and the second material 225. In some embodiments, the insulation layer 270 is further disposed between the metal grid structures 250 and the multilayer reflective stacks 215 (e.g., such that the metal grid structures 250 are isolated from the multilayer reflective stacks 215 and the attenuation layer 265). In some embodiments, the insulation layer 270 can be characterized by a thickness C that can be from about 10 nm to about 100 nm. While the thickness C is described as being determined at least in part to chemically isolate the metal grid structures 250 and the attenuation layer 265, the thickness C can be based at least in part on size and/or shape constraints of the example image sensor 100. To that end, the thickness C can less than or equal to about 100 nm, about 90 nm, about 80 nm, about 70 nm, about 60 nm, about 50 nm, about 40 nm, about 30 nm, about 20 nm, or about 10 nm, including fractions and interpolations thereof, provided that the insulation layer 270 electrically isolates the metal grid structures 250 from the attenuation layer 265.

As shown in FIG. 2B, multilayer reflective stacks 215 are disposed overlying the dielectric layer 235. In some embodiments, the dielectric layer 235 is characterized by a thickness 280 from about 90 nm to about 200 nm. In some embodiments, the dielectric layer 235 is characterized by thickness 280 of about 90 nm, about 100 nm, about 110 nm, about 120 nm, about 130 nm, about 140 nm, about 150 nm, about 160 nm, about 170 nm, about 180 nm, about 190 nm, or about 200 nm, including fractions and interpolations thereof. Advantageously, a reduced value for the thickness 280 reduces the overall size of example image sensor 100 and improves multiple process factors including fabrication time, material demand, and economic factors such as material cost. In some embodiments, the dielectric layer 235 functions as a passivation layer and/or diffusion barrier layer that preserves the functionality of the plurality of photodiodes 210, for example, by preventing oxygen or other atoms and/or molecules from diffusing into or out of semiconductor substrate 205. To that end, below a given thickness, the dielectric layer 235 can permit the diffusion of species into and/or out of semiconductor substrate 205 that can impair the performance of the plurality of photodiodes 210 and detrimentally affect the performance of example image sensor 100. In some embodiments, the dielectric layer 235 corresponds to a planarized process buffer layer (e.g., a buffer oxide layer), which facilitates planarization during processing (i.e., before fabrication of the multilayer reflective stacks 215, the attenuation layer 265, the insulation layer 270, the color filters 245, the microlenses 120, and the microlenses 125, or other constituent components of the example image sensor 100). For example, the dielectric layer 235 may fill in any etched trenches or valleys formed during fabrication, which may provide support and/or relieve mechanical stress that occurs during chemical mechanical polishing.

Figure 2C:
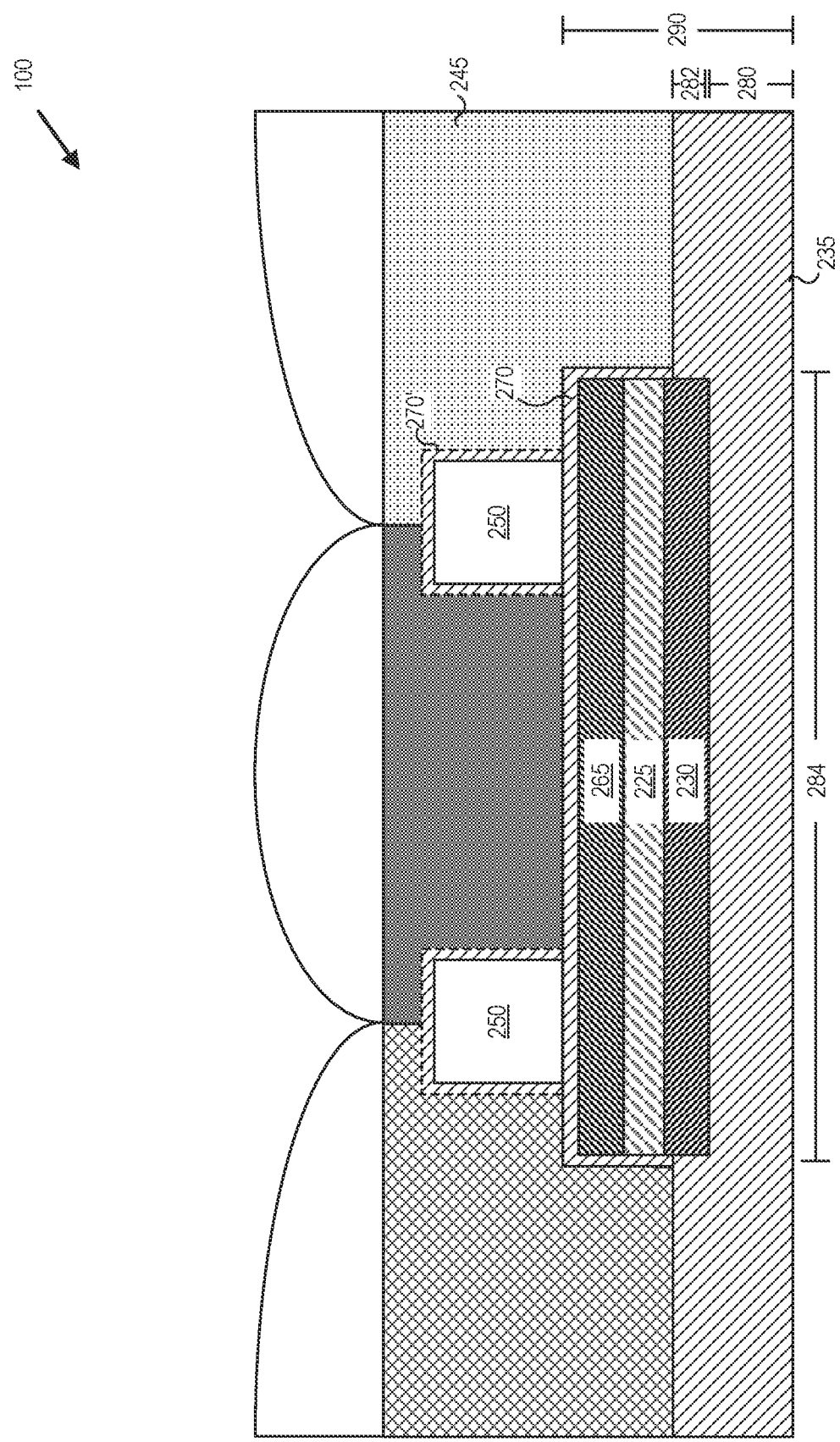
FIG. 2C is a schematic diagram illustrating a section view of the example image sensor of FIG. 1 along section plane AA' including an embedded multilayer reflective stack, in accordance with embodiments of the present disclosure.

FIG. 2C is a schematic diagram illustrating a section view of the example image sensor 100 of FIG. 1 along section plane AA' including an embedded multilayer reflective stack 215 (e.g., at least one of the first material 230, the second material 225, or the attenuation layer 265 embedded, at least in part, within the dielectric layer 235), in accordance with embodiments of the present disclosure. It is appreciated that the first material 230 and the second material 225 illustrated in FIG. 2C, may correspond to one of the multilayer stacks 215 illustrated in FIG. 1-2B. In some embodiments, the second material 225, the insulation layer 270 and 270', and the dielectric layer 235 include silicon oxide(s), such as silicon dioxide. As such, the same or similar optical activity discussed in reference to FIGS. 2A-2B, with respect to internal reflection of incident radiation 260 at an angle α or greater, can be achieved by at least partially embedding one or more of the multilayer reflective stacks 215 (e.g., at least one of the first material 230, the second material 225, or the attenuation layer 265) into the dielectric layer 235, to achieve a reduced combined thickness 290. As described in more detail in reference to FIGS. 4A-4F, focused on an example fabrication process 300 (in reference to FIG. 3), the dielectric layer 235 can be deposited having a thickness 280 less than 90 nm, such that the combined thickness 290 of the dielectric layer 235 and multilayer reflective stacks 215 is less than or equal to about 200 nm. In the context of the present disclosure, open-ended dimensional ranges are understood to be limited by processing equipment that can introduce fabrication constraints on deposition thicknesses. For example, while the multilayer reflective stacks 215 can be less than or equal to about 200 nm thick, the lower limit of combined thickness 290 can be greater than zero, for example, where each of the dielectric layer 235 and multilayer reflective stack 215 have a respective lower limit of deposition thickness on a given CMOS processing system. In some embodiments, the combined thickness 290 is from about 50 nm to about 150 nm. In some embodiments, the combined thickness 290 is about 50 nm, about 60 nm, about 70 nm, about 80 nm, about 90 nm, about 100 nm, about 110 nm, about 120 nm, about 130 nm, about 140 nm, or about 150 nm, including interpolations and fractions thereof. As described above, reducing the combined thickness 290 improves multiple process, performance, and material parameters associated with designing and fabricating the example image sensor 100, but also improves optical efficiency of the plurality of photodiodes 210 (e.g., improved angular response) associated with a reduced absorbance by the dielectric layer 235, for example. As such, at least partially embedding one or more of the multilayer reflective stacks 215 in the dielectric layer 235 permits the example image sensor 100 to include the multilayer reflective stacks 215 with little or no increase in overall dimensions of the example image sensor 100. Advantageously, limitations on thickness 280, arising for example from species diffusion constraints, stress or strain considerations from chemical mechanical polishing, or the like can be addressed by embedding one or more of the multilayer reflective stacks 215 in the dielectric layer 235, such that thickness 280 as described in more detail in reference to FIG. 2B is maintained while also reducing the combined thickness 290.

Figure 4A:
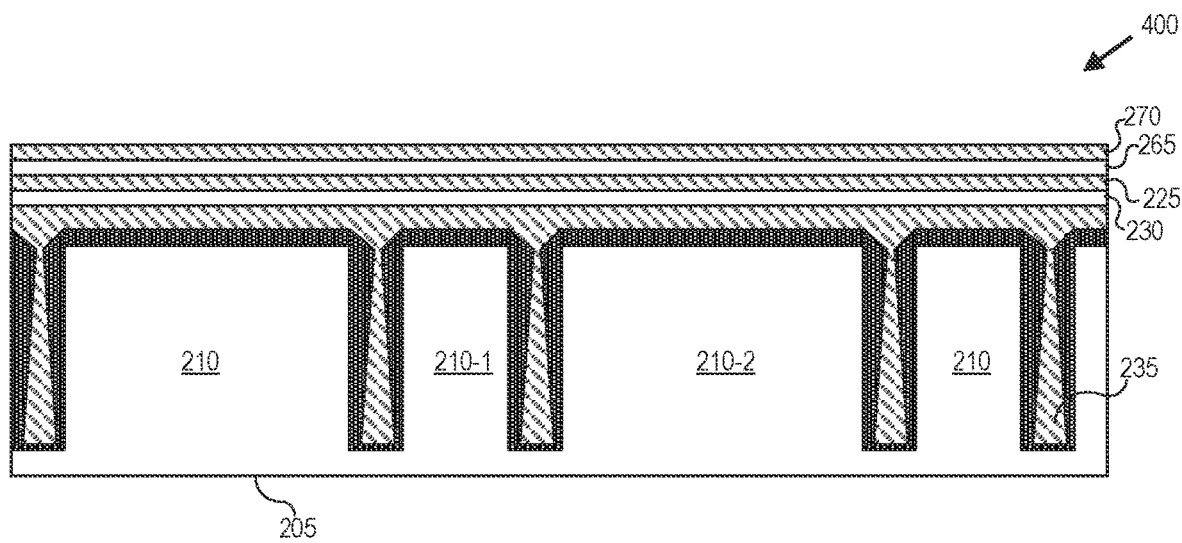
FIGS. 4A-4F are schematic diagrams illustrating intermediate states of the example image sensor of FIGS. 1-2C during operations of the example process of FIG. 3, in accordance with embodiments of the present disclosure.

To facilitate embedding one or more of the multilayer reflective stacks 215 into the dielectric layer 235, the dielectric layer 235 may be planarized and then selectively etched to form trenches that have a width 284 (e.g., corresponding to a lateral area having the same or greater lateral dimensions as the multilayer reflective stacks 215) and depth 282. The multilayer reflective stacks 215 and subsequent components may then be formed such that they fill the trenches. The depth 282 that the multilayer reflective stacks 215 are embedded into the dielectric layer 235 may range from partial (e.g., only a portion of the first material 230 may be disposed within the dielectric layer 235) to full (e.g., both the first material 230 and the second material 225 may be fully embedded within the dielectric layer 235). In some embodiments, the first material 230 of the multilayer reflective stacks 215 is fully embedded within the dielectric layer 235 while the second material is partially embedded within the dielectric layer 235. In some embodiments, the insulation layer 270 may make conformal contact with the multilayer reflective stacks 215 (e.g., at least partially contact sidewalls as illustrated in FIG. 4D). In the same or other embodiments, the insulation layer is disposed between the metal grid structures 250 and the multilayer reflective stacks 215 (e.g., the insulation layer 270 is disposed between the metal grid structures 250 and the attenuation layer 265). In the same or other embodiments, the insulation layer 270 may optionally be extended (e.g., via a second deposition after the formation of the metal grid structures 250) such that an extended portion 270' of the insulation layer 270 at least partially encapsulates the metal grid structures 250 (e.g., the extended portion 270' of the insulation layer 270 is disposed between the color filters 245 and the metal grid structures 250).

Figure 3:
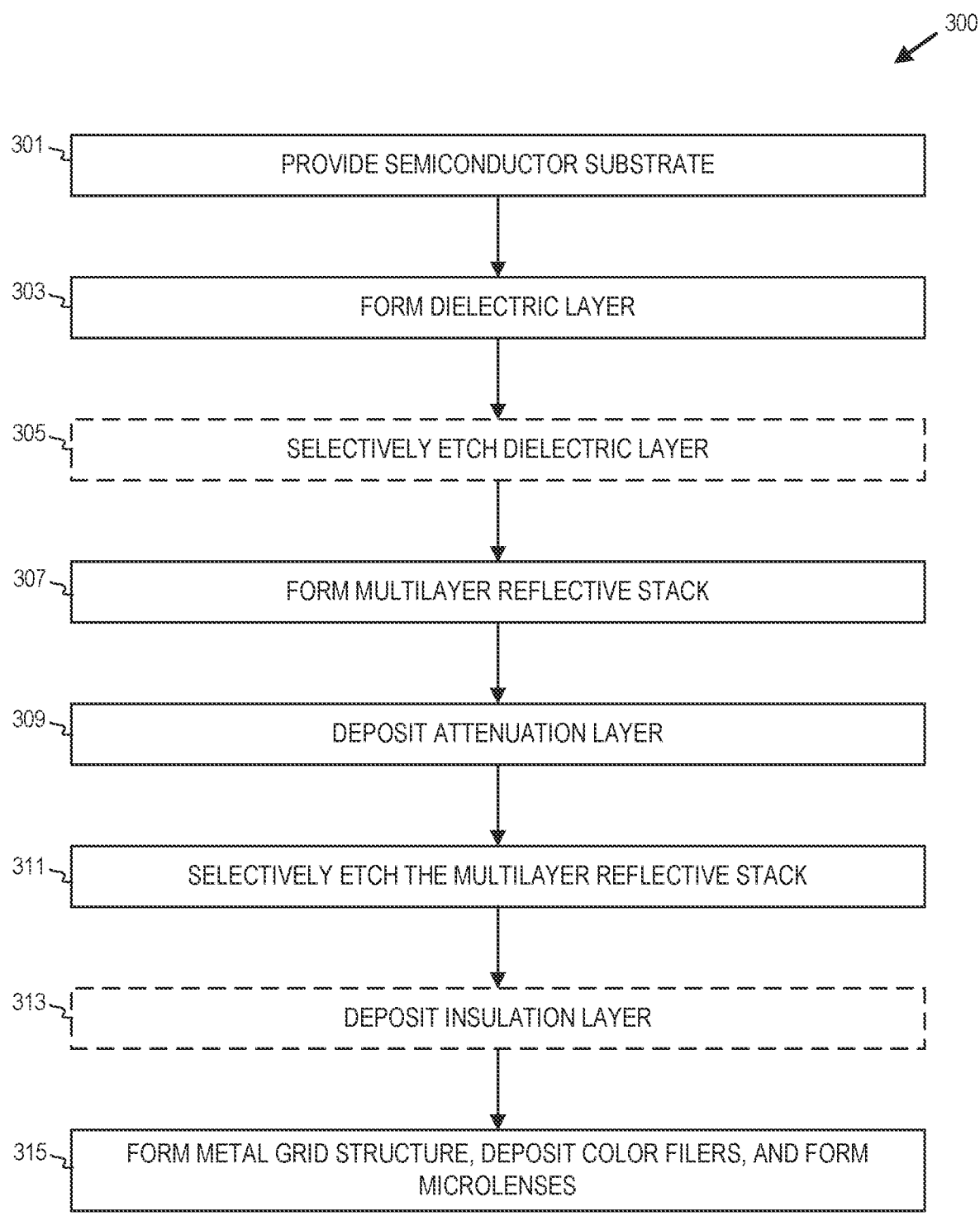
FIG. 3 is a block flow diagram illustrating an example process for fabricating the example image sensor of FIGS. 1-2C, in accordance with embodiments of the present disclosure.

FIG. 3 is a block flow diagram illustrating an example process 300, including process blocks 301, 303, 305, 307, 398, 311, 313, and 315 for fabricating the example image sensor 100 of FIGS. 1-2C, in accordance with embodiments of the present disclosure. Cross sectional diagrams in FIGS. 4A-4F illustrate intermediate states 420, 430, 440, and 450 of the example image sensor 100, which may correspond to one or more of the process blocks 301-315 included in the example process 300. As such, FIGS. 4A-4F are understood to represent a temporary structure as fabrication proceeds through the example process 300 including multiple fabrication, refining, and finishing steps, not all of which are illustrated. In some embodiments, the process blocks 301-315 of the example process 300 can be repeated, reordered, or omitted.

The example process 300 starts with an intermediate structure that includes the one or more isolation structures 220 (e.g., deep trench isolation structures, shallow trench isolation structures, or combinations thereof) and the plurality of photodiodes 210 (e.g., the first photodiodes 210-1 and the second photodiodes 210-2).

The process block 301 for the fabrication process of example image sensor 100 including providing a wafer substrate or a semiconductor substrate (e.g., the semiconductor substrate 205 illustrated in FIGS. 2A-2C) including a plurality of photodiodes (e.g., the plurality of photodiodes 210 illustrated in FIGS. 2A-2C) disposed therein and separated by one or more isolation structures (e.g., the one or more isolation structures 220 illustrated in FIGS. 2A-2C). In some embodiments, the plurality of photodiodes includes a first photodiode (e.g., one of the first photodiodes 210-1 illustrated in FIGS. 2A-2C) and a second photodiode (e.g., one of the second photodiodes 210-2 illustrated in FIGS. 2A-2C) adjacent to the first photodiode. As such, FIGS. 4A-4F focus discussion on aspects of forming multilayer reflective stack 215 by CMOS-compatible processes, such as reactive ion etching, plasma deposition, patterned deposition and etch, planarization, or the like. It is contemplated that various processing operations have been implemented to form the illustrated structures, but such operations are not all explicitly disclosed (e.g., photoresist deposition, patterning, and/or removal). Additionally, at least some of the intermediate states shown can be optional or alternative forms, where applicable. For example, FIGS. 4C-4D illustrate alternative embodiments to those illustrated in FIGS. 4E-4F, corresponding to embodiments illustrated in FIG. 2B and FIG. 2C, respectively.

The process block 303 illustrates forming a dielectric layer (e.g. the dielectric layer 235 illustrated in FIGS. 2A-2C) over the semiconductor substrate (e.g., the semiconductor substrate 205 illustrated in FIGS. 2A-2C). In some embodiments, the dielectric layer can be, include, or otherwise correspond to a buffer oxide layer. The dielectric layer may be formed in accordance with CMOS-compatible deposition processes. In some embodiments, the dielectric layer is planarized (e.g., when the dielectric layer corresponds to a buffer oxide layer), for example, by chemical mechanical polishing. In some embodiments, the dielectric layer is characterized as having a third refractive index.

The process block 305 is an optional process that may be included in the example process 300 that shows selectively etching the dielectric layer formed during block 303. Specifically, in some embodiments, the multilayer stacks may be embedded, at least partially, within the dielectric layer. One way to facilitate this feature is to form trenches within the dielectric layer in intended locations where the multilayer stacks are to be formed (see, e.g., FIG. 2C). The trenches may be formed by selectively etching the dielectric layer in an appropriate manner and with an appropriate etch depth (e.g., based on the depth 282 illustrated in FIG. 2C). It is appreciated that in some embodiments, a width of the trenches may be equivalent to a width of the multilayer reflective stacks (e.g., the width 284 illustrated in FIG. 2C).

The process block 307 shows forming one or more multilayer reflective stacks (e.g., the multilayer reflective stacks 215 illustrated in FIGS. 2A-2C) over the dielectric layer from the process block 303 such that the dielectric layer is disposed between the multilayer reflective stack and the plurality of photodiodes (e.g., the first photodiodes 210-1 and/or the second photodiodes 210-2 illustrated in FIGS. 2A-2C). The multilayer reflective stack may be formed by sequential deposition steps, in which a first material (e.g., the first material 230 illustrated in FIGS. 2A-2C) having a first refractive index and a second material (e.g., the second material 225 illustrated in FIGS. 2A-2C) having a second refractive index are deposited overlying the dielectric layer via one or more deposition processes such as chemical vapor deposition or atomic layer deposition, as illustrated in FIG. 4A. FIG. 4A is a schematic diagram illustrating a cross-sectional view (e.g., along line A-A' illustrated in FIG. 1) of an intermediate state 400 that includes a low-index refractive material (e.g., the second material 225 illustrated in FIG. 4A) deposited over a high-index refractive material (e.g., the first material 230) during the process block 307 of example process 300 illustrated in FIG. 3. As discussed previously, the first refractive index of the first material corresponds to a high-index refractive material that is greater than the second refractive index of the second material and the third refractive index of the dielectric layer, which both correspond to a low-index refractive material. It is appreciated that due to the sequential deposition of the first material and the second material, the first material is disposed between the second material and the dielectric layer.

The process blocks 303 and 307 of the example process 300 of FIG. 3 are illustrated in sequence, at least in part because of the internal reflection condition, as described in more detail in reference to FIGS. 2B-2C is implemented using a high index material disposed between alternating layers of low-index materials (e.g., the first material 230 disposed between the second material 225 and the dielectric layer 235) to form a reflection interface between the first material 230 and the dielectric layer 235 (e.g., to function as a reflector to mitigate crosstalk from the second photodiodes 210-2 into the first photodiodes 210-1) and in some cases between the first material 230 and the second material 225 (e.g., to function in a manner akin to a waveguide to direct out laterally). As described in more detail in reference to FIGS. 2A-2C, the first material 230 can be or include a metal, an oxide, and/or a nitride, such as titanium, tantalum oxide, silicon nitride, titanium nitride, or the like, such that the first refractive index of the first material 230 is higher than that of the dielectric layer 235, which in some embodiments satisfies the internal reflection condition of Snell's law to reflect incoming light incident on a surface of semiconductor substrate 205 at an incident angle greater or equal to specific incident angle range (e.g., between 30 degrees to 60 degrees with respect to an axis normal to the surface of semiconductor substrate 205 or as otherwise described in reference to the angle of incident threshold such as angle of incidence "α" of FIG. 2B). To that end, the first material 230 can be or include one or more materials that are compatible with CMOS processes (e.g., plasma deposition, wet and/or dry etching, etc.), for spatially selective deposition and/or removal with precise depth control to meet the dimensions of each constituent material layer within tolerances, as described in more detail in reference to FIGS. 2A-2C.

The process block 309 of the example process 300 illustrated in FIG. 3 optionally includes depositing an attenuation layer (e.g. the attenuation layer 265 illustrated in FIGS. 2A-2C) overlying the second material (e.g., the second material 225 illustrated in FIGS. 2A-2C) for attenuating incoming light. As described in more detail in reference to FIG. 2B, the attenuation layer 265 can include multilayer structures including alternating layers of titanium/titanium nitride. To that end, the process block 309 can include multiple thickness-controlled deposition processes for forming multilayer films overlying the second material 225. In an illustrative example, the attenuation layer can include one or more layers to achieve specific absorption and/or reflection optical characteristics. Advantageously, the attenuation layer 265 can improve the performance of the first pixel structures 105 by reducing the likelihood of saturation of first photodiodes 210-1 (e.g., by attenuating electromagnetic radiation incident on first pixel structures 105 via reflection, absorption and/or refraction). In some embodiments, therefore, the thickness A (in reference to FIG. 2B) of the attenuation layer 265 exceeds the thickness B of the first material 230 (in reference to FIG. 2B) to provide needed optical effect (e.g., reflectance and absorption achieving desired quantum efficiency of first photodiodes 210-1). Beyond a given number of layers, however, the attenuation layer 265 can inhibit performance of the first photodiodes 210-1, based at least in part on path-dependent absorption of electromagnetic radiation transiting attenuation layer 265.

Subsequent to the process block 309, the example process 300 illustrated in FIG. 3 may optionally include planarizing an upper surface of the topmost material layer for subsequent processes. In one example, a chemical mechanical polishing process can be used to smooth or planarize an upper surface of the attenuation layer. Additionally or alternatively, subsequent to process block 309, the example process 300 may optionally include depositing an insulation layer (e.g., the insulation layer 270 illustrated in FIG. 4A). However, in other embodiments, deposition of the insulation layer may be deposited at one or more later stages (e.g., after or during process blocks 311 and/or 315).

Figure 4B:
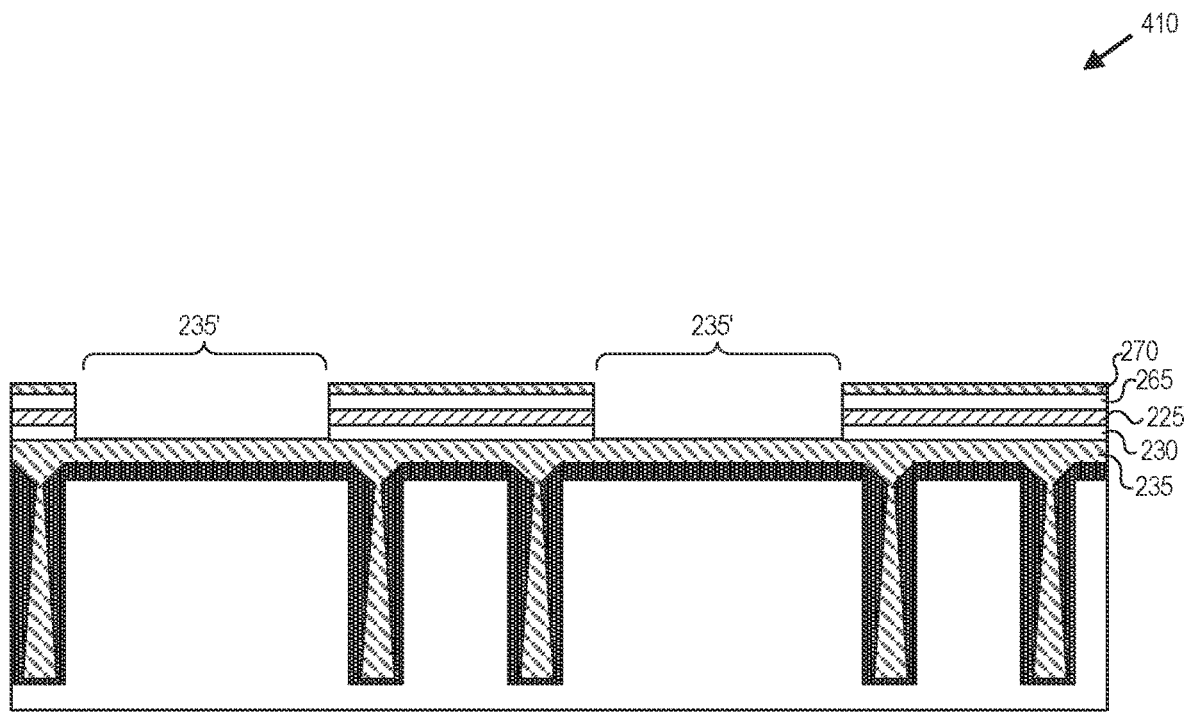
Figure 4C:
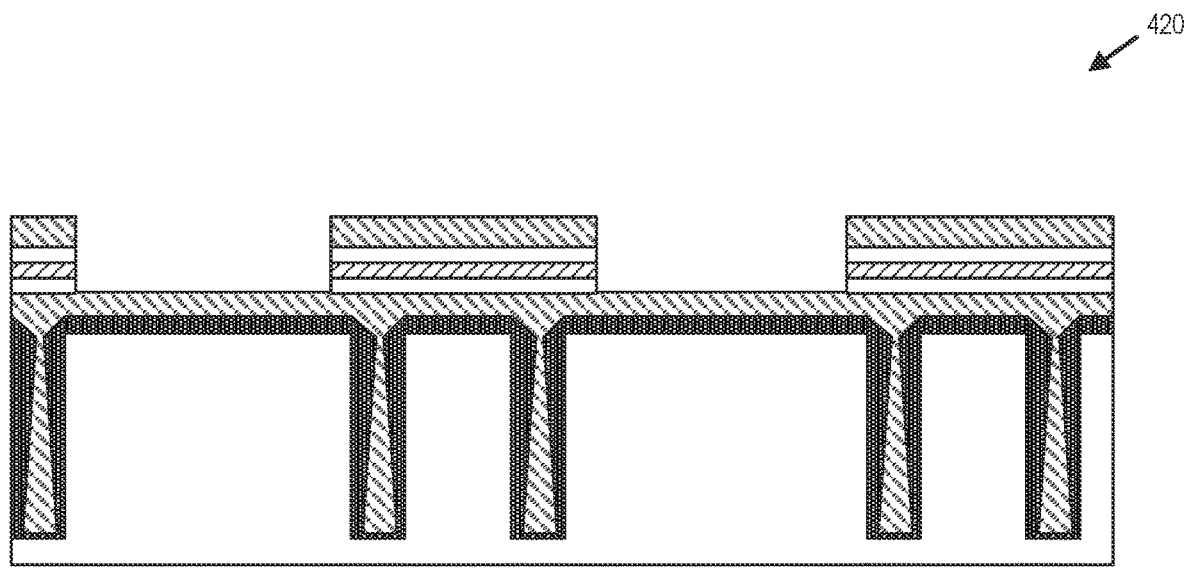
Figure 4D:
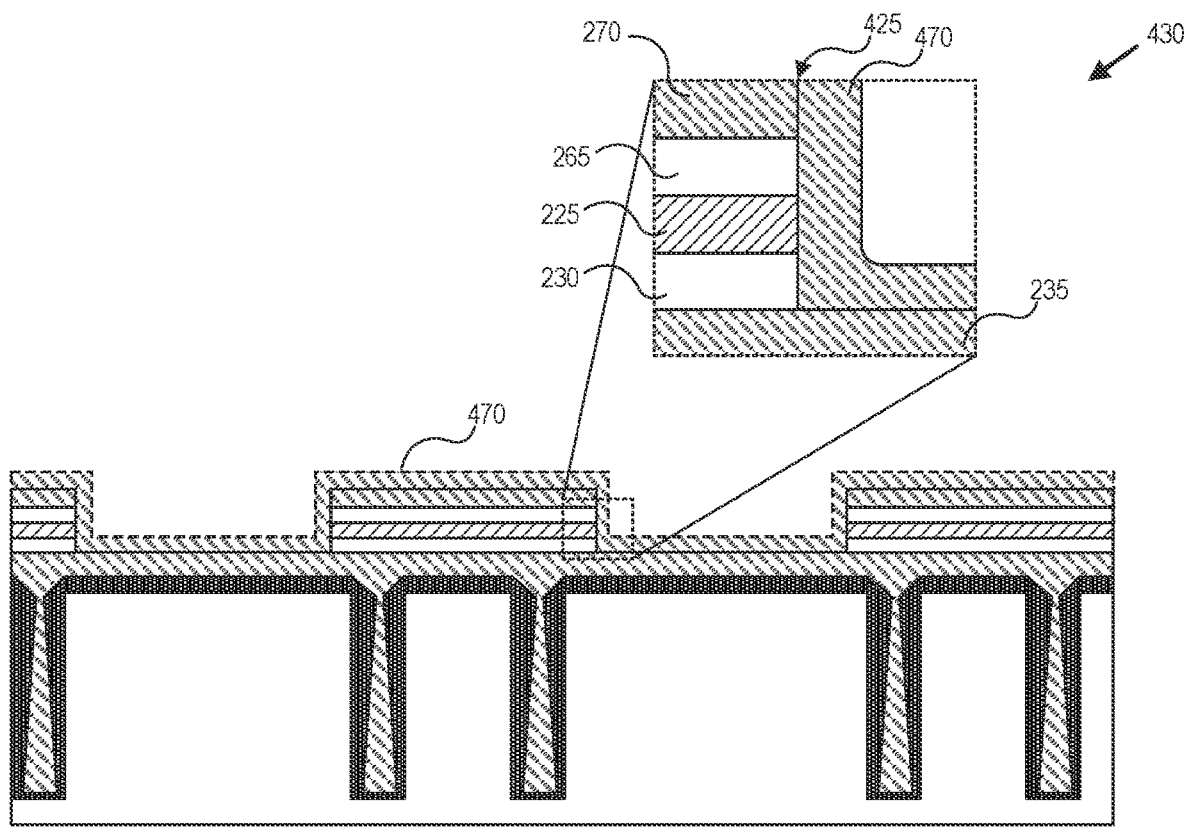
Figure 4E:
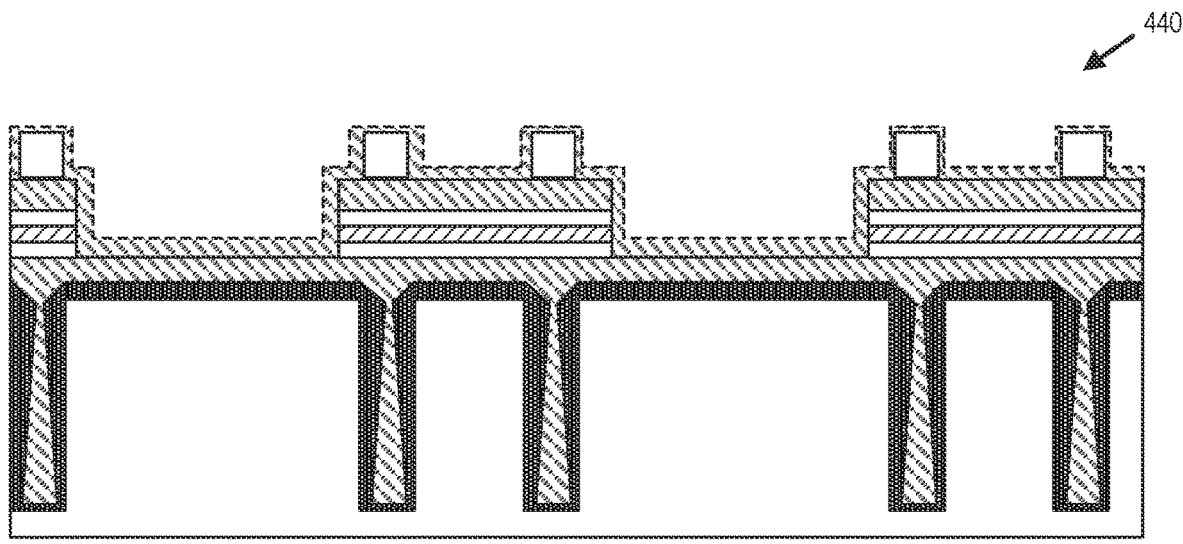

The process block 311 illustrates selectively etching the multilayer reflective stack until exposing the dielectric layer to remove a portion of the multilayer reflective stack disposed over the second photodiodes and to provide exposed portions (e.g., exposed portions 235' of the dielectric layer 235 illustrated in FIG. 4B). In other words, subsequent to the process block 309, the example process 300 illustrated in FIG. 3 can include removing a portion of the multilayer reflective stack and/or overlying materials (e.g., the multilayer reflective stack 215, the attenuation layer 265, and the insulation layer 270 as illustrated by intermediate state 410 in FIG. 4B) at the process block 311. Removal processes can be spatially localized and/or patterned such that material is selectively removed from regions corresponding to or overlying each of the second photodiodes (e.g., the second photodiodes 210-2 associated with the second pixel structures 110 illustrated in FIGS. 1-2C). Removal, in this context, refers to one or more of a number of CMOS-compatible techniques for etching a portion of a semiconductor and/or dielectric materials or substrates. In an illustrative example, an etch-stop or otherwise selective material can be deposited according to a pattern overlying the intermediate state 400 of FIG. 4A (e.g., using a patterned photoresist to restrict deposition to regions corresponding to first pixel structures 105 of FIGS. 1-2C), following which wet etch and/or dry etch processes can be used to etch through constituent components (e.g., the attenuation layer 265, second material 225, and the first material 230 illustrated in FIG. 4B). By selecting etch processes to be selective to oxides, nitrides, or metals, removal processes of the process block 311 can be controlled to stop substantially at layer boundaries. For example, by applying a wet etch that is selective to oxides, but is unselective to nitrides, the insulation layer (e.g., the insulation layer 270 illustrated in FIG. 4B) can be selectively removed without etching into the attenuation layer (e.g., the attenuation layer 265 illustrated in FIG. 4B). Similarly, removing the first material (e.g., the first material 230 illustrated in FIG. 4B) with a metal or nitride selective etch can permit the etch reaction to effectively stop at the dielectric layer (e.g., the dielectric layer 235 illustrated in FIG. 4B).

The process block 313 shows an optionally process of depositing an insulation layer over the multilayer reflective stack (e.g., the stack of materials including the first material 230, the second material 225, the attenuation layer 265, and optionally the optional insulation layer 270 as illustrated in FIG. 4B) and the exposed portions (e.g., the exposed portions 235' of the dielectric layer 235 illustrated in FIG. 4B) of the dielectric layer. In some embodiments, the insulation layer at least partially conforms to one or more sidewalls of the multilayer reflective stacks (e.g., as illustrated in FIG. 4D, a conformal layer 470 of the insulation layer 270 conforms to one or more sidewalls 425 of the multilayer reflective stacks). Subsequent to removing a portion of multilayer reflective stack, the example process 300 includes depositing material for forming the insulation layer at the process block 313, as illustrated in intermediate state 420 illustrated in FIG. 4C. As described in more detail in reference to FIGS. 2A-2C, depositing the insulation layer 270 at process block 313 of FIG. 3 provides material insulation. For example, the insulation layer 270 chemically isolates subsequent formed metal grid structures 250 and color filters 245 from the attenuation layer 265 and/or the first material 230 as well as separating the metal grid structures 250 from the color filter 245. To that end, the insulation layer 270 can be deposited at the thickness C (in reference to FIG. 2B), that achieves the material isolation of the metal grid structures 250 from multilayer reflective stacks 215, isolates the metal grid structures 250 from the color filters 245, and isolates the color filters 245 from the attenuation layer 265, while also permitting the combined thickness 290 of the multilayer reflective stacks 215 to be as described above in reference to FIGS. 2A-2C.

In some embodiments, the thickness C can be from about 10 nm to about 100 nm. While the thickness C is described as being determined at least in part to chemically isolate the metal grid structures 250 and the attenuation layer 265, the thickness C can be based at least in part on size and/or shape constraints of the example image sensor. To that end, the thickness C can be less than or equal to about 100 nm, about 90 nm, about 80 nm, about 70 nm, about 60 nm, about 50 nm, about 40 nm, about 30 nm, about 20 nm, or about 10 nm, including fractions and interpolations thereof, provided that the insulation layer 270 electrically isolates metal grid structures 250 from the attenuation layer 265.

In some embodiments, as described in more detail in reference to FIG. 2C, the example process 300 includes disposing the insulation layer 270, such that the insulation layer 270 at least partially conforms one or more sidewalls 425 of the multilayer reflective stacks 215 as illustrated in FIG. 4D, which provides an example of at least partially conformal layer 470 of the insulation layer 270 in intermediate state 430. The conformal layer 470 may comprise dielectric material such as oxide-based material (e.g., silicon dioxide). In one example, the conformal layer 470 and the dielectric layer 235 may be formed of the same material. In some embodiments, the example process 300 illustrated in FIG. 3 includes one or more removal processes to selectively remove the conformal layer 470 illustrated in FIG. 4D. The intermediate state 430 corresponds with an embodiment of the example image sensor 100 where multilayer reflective stack is at least partially embedded in the dielectric layer 235 as illustrated in FIG. 2C. The process block 313, therefore, supplements thickness 280 of the dielectric layer 235 by the added thickness of insulation layer 270 and to a point that affords chemical passivation of the surface of semiconductor substrate 205 while not impairing quantum efficiency of the plurality of photodiodes 210 of second pixel structures 110 and increasing angular response (e.g., as illustrated in FIGS. 1-2C). To that end, the combined thickness 290 illustrated in FIG. 2C can be, as described above, between about 100 nm to about 130 nm.

The process block 315 illustrates forming metal grid structures (e.g., the metal grid structures 250 illustrated in FIGS. 2A-2C), depositing color filters (e.g., the color filters 245 illustrated in FIGS. 2A-2C), and forming microlenses (e.g., the microlenses 120 and 125 illustrated in FIGS. 2A-2C). In some embodiments, the example process 300 illustrated in FIG. 3 includes one or more processes between the process block 313 and at least part of the process block 315 for depositing metal material for forming the metal grid structure 250 on the insulation layer 270, as illustrated in intermediate state 440 in FIG. 4E. As shown, the metal grid structure 250 can be disposed overlying the insulation layer 270 prior to deposition of the conformal layer 470 illustrated in FIG. 4C of the insulation layer 270, such that the metal grid structure 250 is at least partially embedded in the insulation layer 270 (e.g., the conformal layer 470 of the insulation layer 270 at least partially encapsulates the metal grid structure 250). Where the insulation layer 270 includes the same or similar material (e.g., silicon oxide) as included in the dielectric layer 235, the multilayer reflective stack 215 and the metal grid structure 250 can be embedded in the dielectric layer 235. In this way, the metal grid structure 250 can be chemically isolated from the multilayer reflective stack 215 and also from additional/alternative structures subsequently formed overlying intermediate state 440 illustrated in FIG. 4E. In addition, subsequently deposited color filter material (e.g., to form the color filters 245 illustrated in FIGS. 2A-2C) can also be insulated from the metal grid structure 250. As with intermediate state 430, conformal layer 470 can be at least partially conformal with surfaces of the metal grid structure 250, based at least in part on deposition thickness of the insulation layer 270, or more specifically the conformal layer 470, and the type of deposition techniques employed that can introduce defects in conformality, such that the term "conformal" does not inherently refer to a completely conformal layer.

Figure 4F:
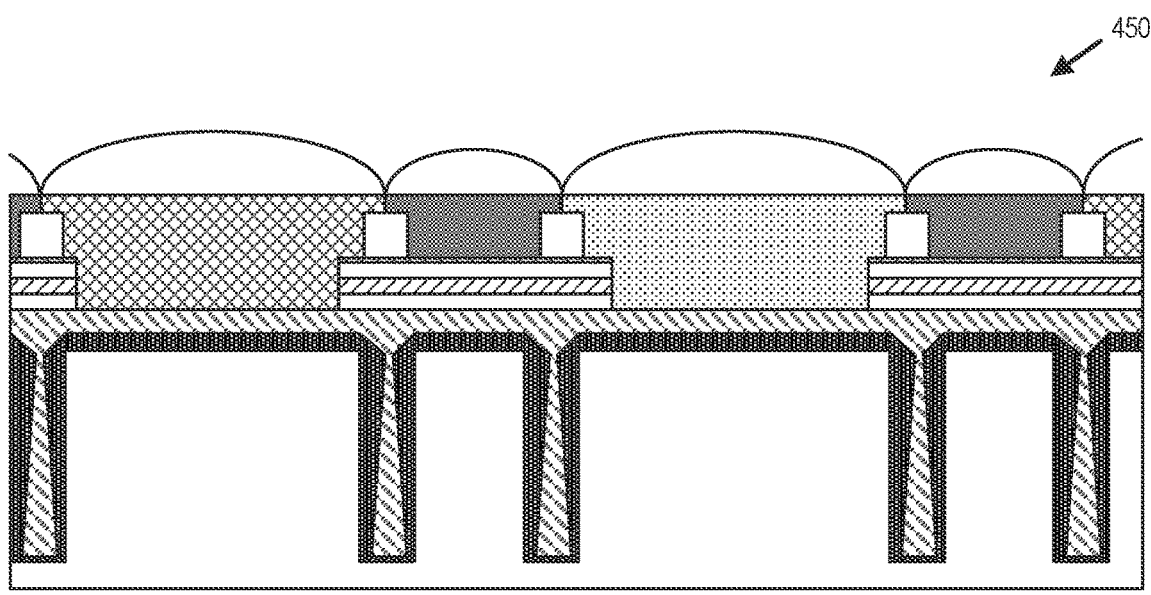

The process block 315 illustrated in the example process 300 of FIG. 3 may further include additional operations for forming color filters and microlenses (e.g., the color filters 245, microlenses 120, and microlenses 125 illustrated in FIGS. 1-2C), as well as additional or alternative structures, as illustrated in state 450 illustrated in FIG. 4F, which reproduces the cross-section view of FIG. 2A. While not described in detail, it is understood that processes for depositing color filters 245 can include patterned polymer deposition (e.g., by photolithography), followed by planarization (e.g., by chemical mechanical polishing configured for planarizing a polymer surface). Similarly, the microlenses 120 and 125 can be fabricated and subsequently transferred onto the color filters 245 in accordance with the tessellated pattern of the first pixel structures 105 and the second pixel structures 110 as illustrated in FIG. 1. In this way, intermediate states 420-440 of FIGS. 4C-4E can be further fabricated into the example image sensor 100, which can be configured to function as a sensor of electromagnetic radiation in the visible spectrum or invisible radiation including, but not limited to, ultraviolet, infrared, or higher energy electromagnetic radiation. Further, the example image sensor can be configured for selective imaging at pre-determined wavelengths by depositing filter material that provides energy-selective filters other than the RGB color triad discussed.

Figure 5:
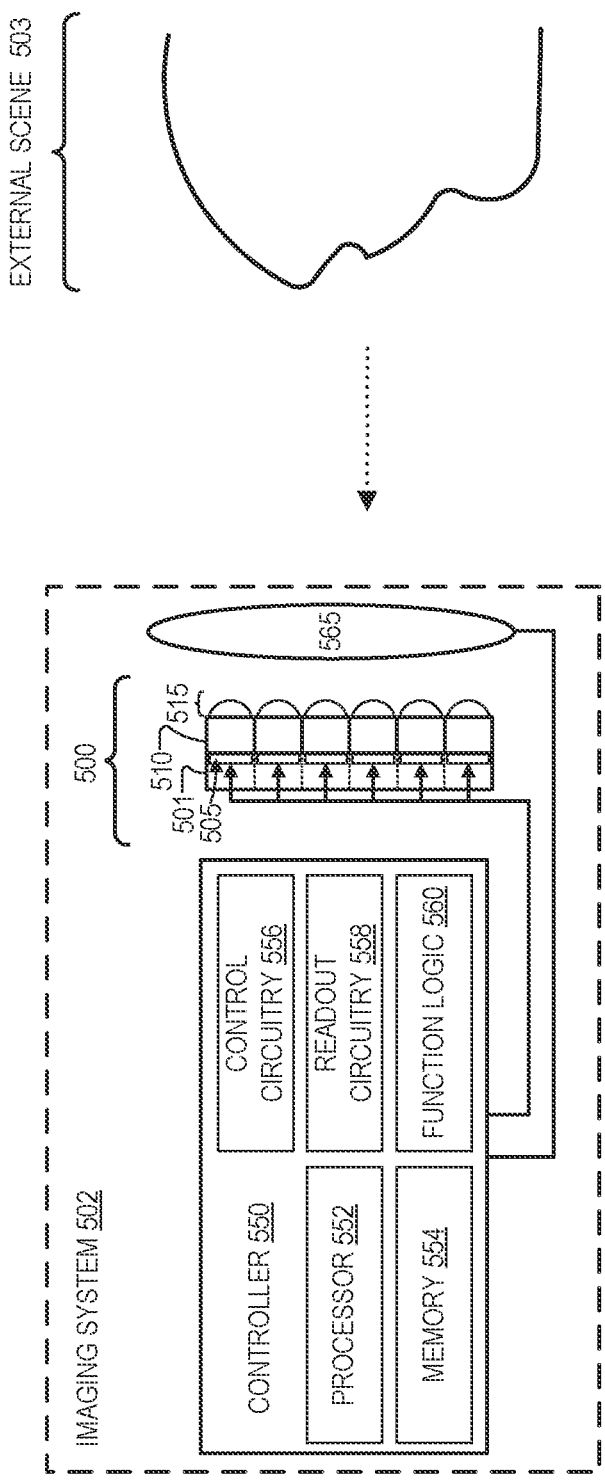
FIG. 5 is a functional block diagram of an imaging system including an image sensor with a multilayer reflective stack described in exemplary embodiments of FIGS. 1-4F, in accordance with embodiments of the present disclosure.

FIG. 5 is a functional block diagram of an imaging system 502 including an image sensor 500 described in an exemplary embodiment in FIGS. 1-4F, in accordance with embodiments of the present disclosure. Image sensor 500 can have a structure corresponding to example image sensor 100 illustrated in FIG. 1, with first pixel structures 105 and second pixel structures 110 as described in more detail in reference FIGS. 1-2C. The imaging system 502 includes image sensor 500 to generate electrical or image signals in response to incident radiation 570, objective lens(es) 565 with adjustable optical power to focus on one or more points of interest within the external scene 503, and controller 550 to control, inter alia, operation of image sensor 500 and objective lens(es) 565. Image sensor 500 is one possible implementation of example image sensor 100 illustrated in FIG. 1. Image sensor 500 is a simplified schematic showing a semiconductor material 501 with a plurality of photodiodes 505 disposed within respective portions of the semiconductor material 501, a plurality of color filters 510, and a plurality of micro-lenses 515. The controller 550 includes one or more processors 552, memory 554, control circuitry 556, readout circuitry 558, and function logic 560.

The controller 550 includes logic and/or circuitry to control the operation (e.g., during pre-, post-, and in situ phases of image and/or video acquisition) of the various components of imaging system 502. The controller 550 can be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In one embodiment, the controller 550 includes the processor 552 coupled to memory 554 that stores instructions for execution by the controller 550 and/or one or more other components of the imaging system 502. The instructions, when executed, can cause the imaging system 502 to perform operations associated with the various functional modules, logic blocks, or circuitry of the imaging system 502 including any one of, or a combination of, the control circuitry 556, the readout circuitry 558, the function logic 560, image sensor 500, objective lens 565, and any other element of imaging system 502 (illustrated or otherwise). The memory is a non-transitory computer-readable medium that can include, without limitation, a volatile (e.g., RAM) or non-volatile (e.g., ROM) storage system readable by controller 550. It is further appreciated that the controller 550 can be a monolithic integrated circuit, one or more discrete interconnected electrical components, or a combination thereof. Additionally, in some embodiments one or more electrical components can be coupled together to collectively function as controller 550 for orchestrating operation of the imaging system 502.

Control circuitry 556 can control operational characteristics of the photodiode array 505 (e.g., exposure duration, when to capture digital images or videos, and the like). Readout circuitry 558 reads or otherwise samples the analog signal from the individual photodiodes (e.g., read out electrical signals generated by each of the plurality of photodiodes 505 in response to incident light to generate image signals for capturing an image frame, and the like) and can include amplification circuitry, analog-to-digital (ADC) circuitry, image buffers, or otherwise. In the illustrated embodiment, readout circuitry 558 is included in controller 550, but in other embodiments readout circuitry 558 can be separate from the controller 550. Function logic 560 is coupled to the readout circuitry 558 to receive image data to de-mosaic the image data and generate one or more image frames. In some embodiments, the electrical signals and/or image data can be manipulated or otherwise processed by the function logic 560 (e.g., apply post image effects such as crop, rotate, remove red eye, adjust brightness, adjust contrast, or otherwise).

Reference throughout this specification to "one example" or "one embodiment" means that a particular feature, structure, or characteristic described in connection with the embodiment is included in at least one embodiment of the present invention. Thus, the appearances of the phrases "in one example" or "one embodiment" in various places throughout this specification are not necessarily all referring to the same embodiment. Furthermore, the particular features, structures, or characteristics can be combined in any suitable manner in one or more embodiments.

Spatially relative terms, such as "beneath," "below." "over," "under," "above," "upper," "top," "bottom," "left," "right," "center," "middle," and the like, can be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device can be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements can also be present.

Throughout this specification, several terms of art are used. These terms are to take on their ordinary meaning in the art from which they come, unless specifically defined herein or the context of their use would clearly suggest otherwise. It should be noted that element names and symbols can be used interchangeably through this document (e.g., Si vs. silicon); however, both have identical meaning.

The processes explained above can be implemented using software and/or hardware. The techniques described can constitute machine-executable instructions embodied within a tangible or non-transitory machine (e.g., computer) readable storage medium, that when executed by a machine (e.g., controller 550 of FIG. 5) will cause the machine to perform the operations described. Additionally, the processes can be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a semiconductor substrate;
   a plurality of photodiodes disposed within the semiconductor substrate, wherein the plurality of photodiodes includes a first photodiode and a second photodiode adjacent to the first photodiode;
   a multilayer reflective stack comprising a first material having a first refractive index and a second material having a second refractive index; and
   a dielectric layer having a third refractive index, the dielectric layer disposed between the first photodiode and the multilayer reflective stack, wherein the first material is disposed between the second material and the dielectric layer, and wherein the first refractive index is greater than the second refractive index and the third refractive index.

2. The image sensor of claim 1, wherein the multilayer reflective stack is optically aligned with the first photodiode and laterally extends over the second photodiode such that the dielectric layer is disposed between a portion of the multilayer reflective stack and the second photodiode.

3. The image sensor of claim 2, wherein a distance the portion of the multilayer reflective stack that extends over the second photodiode corresponds to about 0.5% to about 25% of a width of the second photodiode.

4. The image sensor of claim 1, wherein the multilayer reflective stack is configured to redirect electromagnetic radiation incident on the image sensor at an angle of incidence with respect to an axis normal to a surface of the semiconductor substrate being greater than or equal to about 40 degrees by reflection within the first material.

5. The image sensor of claim 4, wherein the multilayer reflective stack, in conjunction with the dielectric layer, forms a waveguide that confines the redirected electromagnetic radiation within the first material via total internal reflection until the redirected electromagnetic radiation exits the first material and is directed towards the second photodiode.

6. The image sensor of claim 4, wherein the reflection redirects the electromagnetic radiation out of the first material and away from the dielectric layer.

7. The image sensor of claim 1, wherein the first material directly contacts both the dielectric layer and the second material, and wherein a ratio of the first refractive index to the second refractive index is from about 1.1 to about 1.8.

8. The image sensor of claim 7, wherein the third refractive index of the dielectric layer is equivalent to the second refractive index of the second material.

9. The image sensor of claim 1, wherein the multilayer reflective stack is at least partially embedded into the dielectric layer such that a combined thickness of the dielectric layer and the multilayer reflective stack is less than or equal to about 200 nm.

10. The image sensor of claim 1, wherein the first material is characterized by a thickness from about 30 Angstroms to about 300 Angstroms.

11. The image sensor of claim 1, wherein the second material comprises silicon dioxide and wherein the first material comprises titanium, tantalum oxide, or silicon nitride.

12. The image sensor of claim 1, further comprising an attenuation layer and a microlens, wherein the attenuation layer is disposed between the microlens and the multilayer reflective stack, and wherein the microlens is configured to direct incident light toward the first photodiode.

13. The image sensor of claim 12, wherein the attenuation layer is thicker than the first material of the multilayer reflective stack.

14. The image sensor of claim 1, further comprising:
   a first color filter optically aligned with the first photodiode such that the multilayer reflective stack is disposed between the first photodiode and the first color filter; and a second color filter optically aligned with the second photodiode such that the first color filter is adjacent to the second color filter, wherein at least a portion of the second color filter is thicker than the first color filter due, at least in part, to a thickness of the multilayer reflective stack.

15. The image sensor of claim 14, further comprising an insulation layer disposed between the first color filter and the multilayer reflective stack, wherein the insulation layer at least partially conforms to a sidewall of the multilayer reflective stack.

16. The image sensor of claim 14, further comprising:
a metal grid structure formed on the multilayer reflective stack disposed between the first color filter and the second color filter; and
an insulation layer disposed between i) the first color filter and the multilayer reflective stack and ii) between the metal grid structure and the multilayer reflective stack.

17. The image sensor of claim 16, wherein the metal grid structure is further disposed between the insulation layer and the multilayer reflective stack, and wherein the insulation layer is further disposed between the first color filter and the metal grid structure.

18. A process for fabricating an image sensor, the process comprising:
providing a semiconductor substrate including a plurality of photodiodes disposed therein and separated by one or more isolation structures, wherein the plurality of photodiodes includes a first photodiode and a second photodiode adjacent to the first photodiode;

forming a dielectric layer having a third refractive index over the semiconductor substrate; and forming a multilayer reflective stack over the dielectric layer such that the dielectric layer is disposed between the multilayer reflective stack and the first photodiode, the multilayer reflective stack including a first material having a first refractive index and a second material having a second refractive index, wherein the first material is disposed between the second material and the dielectric layer, and wherein the first refractive index is greater than the second refractive index and the third refractive index.

19. The process of claim 18, further comprising:
selectively etching the multilayer reflective stack until exposing the dielectric layer to remove a portion of the multilayer reflective stack disposed over the second photodiode and provide an exposed portion of the dielectric layer; and
depositing an insulation layer over the multilayer reflective stack and the exposed portion of the dielectric layer, wherein the insulation layer at least partially conforms to one or more sidewalls of the multilayer reflective stack.

20. The process of claim 18, further comprising:
depositing an attenuation layer over the second material of the multilayer reflective stack, wherein the attenuation layer is thicker than the first material of the multilayer reflective stack.

* * * * *